(12) United States Patent
Nakamura et al.

(10) Patent No.: US 10,827,622 B2
(45) Date of Patent: Nov. 3, 2020

(54) METHOD FOR MANUFACTURING WIRING BOARD

(71) Applicant: Ajinomoto Co., Inc., Tokyo (JP)

(72) Inventors: Shigeo Nakamura, Kanagawa (JP); Chihiro Fujiwara, Kanagawa (JP)

(73) Assignee: Ajinomoto Co., Inc., Tokyo (JP)

( * ) Notice: Subject to any disclaimer, the term of this patent is extended or adjusted under 35 U.S.C. 154(b) by 64 days.

(21) Appl. No.: 15/266,323

(22) Filed: Sep. 15, 2016

(65) Prior Publication Data
US 2017/0086306 A1 Mar. 23, 2017

(30) Foreign Application Priority Data

Sep. 17, 2015 (JP) ................................. 2015-184434

(51) Int. Cl.
| | | |
|---|---|---|
| *H05K 3/00* | (2006.01) | |
| *H05K 3/46* | (2006.01) | |
| *H05K 3/42* | (2006.01) | |
| *H05K 3/04* | (2006.01) | |

(Continued)

(52) U.S. Cl.
CPC ............. *H05K 3/007* (2013.01); *H05K 3/425* (2013.01); *H05K 3/4682* (2013.01); *H05K 3/045* (2013.01); *H05K 3/108* (2013.01); *H05K 2201/0154* (2013.01); *H05K 2201/0195* (2013.01); *H05K 2201/09509* (2013.01); *H05K 2201/09563* (2013.01); *H05K 2203/025* (2013.01)

(58) Field of Classification Search
None
See application file for complete search history.

(56) References Cited

U.S. PATENT DOCUMENTS

| | | |
|---|---|---|
| 8,797,757 B2 | 8/2014 | Kaneko et al. |
| 2003/0180512 A1* | 9/2003 | Andou ............... H05K 3/20 428/209 |

(Continued)

FOREIGN PATENT DOCUMENTS

| | | |
|---|---|---|
| JP | 2005-303274 A | 10/2005 |
| JP | 2012-45887 A | 3/2012 |

(Continued)

OTHER PUBLICATIONS

Japanese Office Action dated Jan. 15, 2019 in Patent Application No. 2015-184434 (with English translation), citing documents AO-AS therein, 10 pages.

(Continued)

*Primary Examiner* — Alexander G Ghyka
(74) *Attorney, Agent, or Firm* — Oblon, McClelland, Maier & Neustadt, L.L.P.

(57) ABSTRACT

Wiring boards, including an embedded type wiring boards and flexible wiring boards, may be produce by: (1) preparing a wiring layer-attached base including a base and a wiring layer provided on at least one surface of the base, (2) laminating an adhesive sheet including (i) a thermosetting resin composition layer and (ii) a resin film layer on the wiring layer-attached base so that the wiring layer will be embedded in (i) the thermosetting resin composition layer and performing thermal curing to form an insulating layer, (3) forming via holes in the insulating layer, (4) forming a conductor layer, and (5) removing the base.

10 Claims, 12 Drawing Sheets

(51) Int. Cl.
    *H03K 3/10*    (2006.01)
    *H05K 3/10*    (2006.01)

(56) References Cited

U.S. PATENT DOCUMENTS

| | | | | |
|---|---|---|---|---|
| 2004/0202781 | A1* | 10/2004 | Higashitani | H05K 1/187 |
| | | | | 427/117 |
| 2012/0125680 | A1* | 5/2012 | Hirose | H05K 3/4602 |
| | | | | 174/266 |
| 2014/0118964 | A1* | 5/2014 | Nakamura | H05K 3/465 |
| | | | | 361/748 |

FOREIGN PATENT DOCUMENTS

| | | |
|---|---|---|
| JP | 2012-74576 A | 4/2012 |
| JP | 2012-146793 A | 8/2012 |
| JP | 2014-107284 A | 6/2014 |
| JP | 2014-156515 A | 8/2014 |
| JP | 2015-082535 A | 4/2015 |
| TW | 201213112 A1 | 4/2012 |
| TW | 201434948 A | 9/2014 |

OTHER PUBLICATIONS

Combined Taiwanese Office Action and Search Report dated Mar. 11, 2020 in Patent Application No. 105129334 (with English translation), citing documents AO and AP therein, 19 pages.
Office Action dated Aug. 27, 2019 issued in corresponding Japanese patent application No. 2015-184434 (with English translation).

\* cited by examiner

METHOD FOR MANUFACTURING WIRING BOARD

CROSS REFERENCES TO RELATED APPLICATIONS

This application claims priority to Japanese Patent Application No. 2015-184434, filed on Sep. 17, 2015, which is incorporated herein by reference in its entirety.

BACKGROUND OF THE INVENTION

Field of the Invention

The present invention relates to methods for manufacturing a wiring board. The present invention further relates to wiring boards and semiconductor devices.

Discussion of the Background

A build-up method that alternately builds up a circuit-formed conductor layer and an insulating layer is widely used as a method for manufacturing a wiring board (a print wiring board), and it is known that the insulating layer is formed by hardening a resin composition (see Japanese Patent Application Laid-open No. 2015-82535, which is incorporated herein by reference in its entirety).

Electronic devices have been progressively miniaturized in recent years. Along therewith, flexible wiring boards that can be bent to be housed in the electronic devices are demanded. In order to enable the wiring boards to be further thinned, wiring boards including an embedded-type wiring layer are desired.

Thus, there remains a need for improved methods of producing wiring boards.

SUMMARY OF THE INVENTION

Accordingly, it is one object of the present invention to provide novel methods for manufacturing a flexible wiring board.

It is another object of the present invention to provide novel methods for manufacturing embedded-type wiring layers.

It is another object of the present invention to provide novel wiring boards.

It is another object of the present invention to provide novel semiconductor devices which contain such a wiring board.

These and other objects, which will become apparent during the following detailed description, have been achieved by the inventors' discovery of the method described below.

Accordingly, the present invention provides:

(1) A method for manufacturing a wiring board, said method comprising:

(a) preparing a wiring layer-attached base comprising a base and a wiring layer provided on at least one surface of said base;

(b) laminating an adhesive sheet comprising (i) a thermosetting resin composition layer and (ii) a resin film layer on said wiring layer-attached base so that said wiring layer will be embedded in (i) said thermosetting resin composition layer and performing thermal curing to form an insulating layer;

(c) forming a via hole in said insulating layer;

(d) forming a conductor layer; and (e) removing said base.

(2) The method according to (1), wherein said adhesive sheet further comprises (iii) metallic foil or a thermosetting resin composition layer and comprises (i) said thermosetting resin composition layer, (ii) said resin film layer, and (iii) said metallic foil or the thermosetting resin composition layer in this order.

(3) The method according to (1) or (2), wherein forming said via hole is performed by laser irradiation.

(4) The method according to any one of (1) to (3), further comprising performing a roughening treatment prior to forming said conductor layer.

(5) The method according to any one of (1) to (4), wherein said wiring board is a flexible wiring board.

(6) The method according to any one of (1) to (5), wherein said adhesive sheet exhibits elongation at break after thermal curing of 2% or more.

(7) The method according to any one of (1) to (6), wherein a surface of (ii) said resin film layer is subjected to corona treatment, plasma treatment, or UV treatment.

(8) The method according to any one of (1) to (7), wherein said metallic foil is copper foil.

(9) The method according to any one of (1) to (8), wherein a minimum pitch of a wiring pattern is 40 µm or less.

(10) A wiring board comprising:

(A) a resin film layer;

(B) an insulating layer; and (C) an embedded-type wiring layer embedded in the insulating layer.

(11) The wiring board according to (10), wherein said wiring board is a flexible wiring board.

(12) The wiring board according to (10) or (11), wherein said insulating layer has a thickness of 2 µm or more.

(13) The wiring board according to any one of (10) to (12), wherein said resin film layer has a thickness of 2 µm or more.

(14) A semiconductor device, comprising a wiring board according to any one of (10) to (12).

The present invention can provide a novel method for manufacturing a flexible wiring board including an embedded-type wiring layer.

The method of manufacture of the present invention can provide a method for manufacturing a wiring board that is excellent in bendability and is excellent in reflow warpage behavior.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

Figure 1:
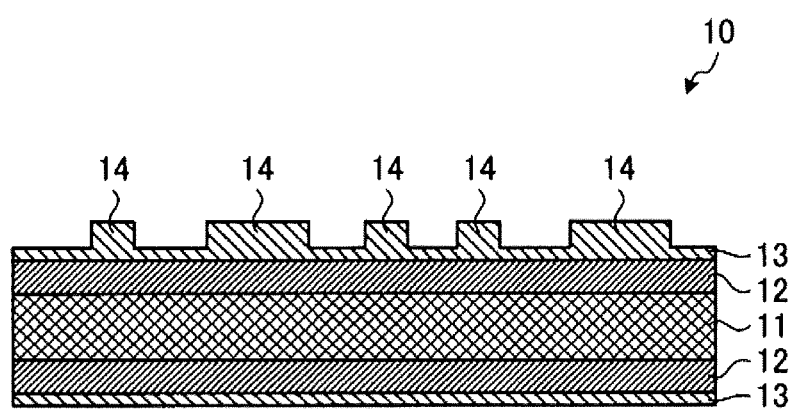
FIG. 1 is a is a schematic sectional view for illustrating a process of manufacturing a wiring board.

In the figures, the reference numerals have the following meanings:

10 Wiring layer-attached base
11 Base (core substrate)
12 First metallic layer
13 Second metallic layer
14 Wiring layer (embedded-type wiring layer)
20 Adhesive sheet
21 (i) Thermosetting resin composition layer (insulating layer)
22 (ii) Resin film layer
23 (iii) Thermosetting resin composition layer (insulting layer)
24 Protective film
25 (iii) Metallic foil
31 Via hole
40 Conductor layer
41 Plating seed layer
42 Electroplated layer
43 Conductor layer
50 Mask pattern
61 Filled via

DETAILED DESCRIPTION OF THE PREFERRED EMBODIMENTS

Before describing the method for manufacturing a wiring board of the present invention, the following describes an adhesive sheet for use in the method of manufacture.

Adhesive Sheet

The adhesive sheet includes (i) a thermosetting resin composition layer and (ii) a resin film layer. The adhesive sheet preferably further includes (iii) metallic foil or a thermosetting resin composition layer. In a preferred embodiment of the adhesive sheet, (i) the thermosetting resin composition layer and (ii) the resin film layer bond to each other, and (ii) the resin film layer and (iii) the metallic foil or the thermosetting resin composition layer bond to each other. The following describes the layers included in the adhesive sheet in detail.

(i) Thermosetting Resin Composition Layer

The adhesive sheet includes (i) the thermosetting resin composition layer. As details will be described below, in manufacturing a wiring board, a wiring layer is embedded in (i) the thermosetting resin composition layer, thereby forming an embedded-type wiring layer. A thermosetting resin composition contained in (i) the thermosetting resin composition layer is not limited to a particular thermosetting resin composition and may be any thermosetting resin composition the hardened product of which has sufficient insulation performance. Examples of the resin composition include a composition containing a thermosetting resin and its hardener. The thermosetting resin may be any of known thermosetting resins used when an insulating layer of the wiring board is formed. Among them, a preferred one is an epoxy resin. Consequently, in one embodiment, the thermosetting resin composition contains (a) an epoxy resin and (b) a curing agent. The thermosetting resin composition may further contain additives such as (c) an inorganic filler, (d) a thermoplastic resin, (e) a curing promoter, (f) a flame retardant, and (g) an organic filler as needed.

(a) Epoxy Resin

Examples of the epoxy resin include a bisphenol A-type epoxy resin, a bisphenol F-type epoxy resin, a bisphenol S-type epoxy resin, a bisphenol AF-type epoxy resin, a dicyclopentadiene-type epoxy resin, a trisphenol-type epoxy resin, a naphthol novolak-type epoxy resin, a phenol novolak-type epoxy resin, a tert-butyl-catechol-type epoxy resin, a naphthalene-type epoxy resin, a naphthol-type epoxy resin, an anthracene-type epoxy resin, a glycidyl amine-type epoxy resin, a glycidyl ester-type epoxy resin, a cresol novolak-type epoxy resin, a biphenyl-type epoxy resin, a linear aliphatic epoxy resin, an epoxy resin having a butadiene structure, an alicyclic epoxy resin, a heterocyclic epoxy resin, a spiro ring-containing epoxy resin, a cyclohexanedimethanol-type epoxy resin, a naphthylene ether-type epoxy resin, a trimethylol-type epoxy resin, and a tetraphenylethane-type epoxy resin. One of the epoxy resins may be contained singly, or two or more of them may be contained in combination. Component (a) is preferably one or more selected from the bisphenol A-type epoxy resin, the bisphenol F-type epoxy resin, and the biphenyl-type epoxy resin.

The epoxy resin preferably contains an epoxy resin having two or more epoxy groups in one molecule. With a non-volatile component of the epoxy resin as 100% by mass, at least 50% by mass is preferably the epoxy resin having two or more epoxy groups in one molecule. The epoxy resin preferably contains an epoxy resin that has two or more epoxy groups in one molecule and is liquid at a temperature of 20° C. (hereinafter, referred to as a "liquid epoxy resin") and an epoxy resin that has three or more epoxy groups in one molecule and is solid at a temperature of 20° C. (hereinafter, referred to as a "solid epoxy resin"). The liquid epoxy resin and the solid epoxy resin are contained in combination as the epoxy resin, thereby providing a resin composition having excellent flexibility. The breaking strength of the hardened product of the resin composition also increases.

Preferred examples of the liquid epoxy resin include a bisphenol A-type epoxy resin, a bisphenol F-type epoxy resin, a bisphenol AF-type epoxy resin, a naphthalene-type epoxy resin, a glycidyl ester-type epoxy resin, a phenol novolak-type epoxy resin, an alicyclic epoxy resin having an ester skeleton, and an epoxy resin having a butadiene structure. More preferred ones are the bisphenol A-type epoxy resin, the bisphenol F-type epoxy resin, the bisphenol AF-type epoxy resin, and the naphthalene-type epoxy resin. Specific examples of the liquid epoxy resin include "HP4032," "HP4032D," and "HP4032SS" (naphthalene-type epoxy resins) manufactured by DIC Corporation; "828US" and "jER828EL" (bisphenol A-type epoxy resins), "jER807" (a bisphenol F-type epoxy resin), "jER152" (a phenol novolak-type epoxy resin), and "YL7760" (a bisphenol AF-type epoxy resin) manufactured by Mitsubishi Chemical Corporation; "ZX1059" (a mixed product of a bisphenol A-type epoxy resin and a bisphenol F-type epoxy resin) manufactured by Nippon Steel & Sumikin Chemical Co., Ltd.; "EX-721" (a glycidyl ester-type epoxy resin) manufactured by Nagase ChemteX Corporation; "Celloxide 2021P" (an alicyclic epoxy resin having an ester skeleton) and "PB-3600" (an epoxy resin having a butadiene structure) manufactured by Daicel Corporation; and "ZX1658" and "ZX1658GS" (liquid 1,4-glycidyl cyclohexane) manufactured by Nippon Steel Chemical Co., Ltd. One of these may be contained singly, or two or more of them may be contained in combination.

Preferred examples of the solid epoxy resin include a naphthalene-type tetrafunctional epoxy resin, a cresol novolak-type epoxy resin, a dicyclopentadiene-type epoxy resin, a trisphenol-type epoxy resin, a naphthol-type epoxy resin, a biphenyl-type epoxy resin, a naphthylene ether-type epoxy resin, an anthracene-type epoxy resin, a bisphenol A-type epoxy resin, and a tetraphenylethane-type epoxy resin. More preferred ones are the naphthalene-type tetrafunctional epoxy resin, the naphthol-type epoxy resin, and the biphenyl-type epoxy resin. Specific examples of the solid epoxy resin include "HP4032H" (a naphthalene-type epoxy resin), "HP-4700" and "HP-4710" (naphthalene-type tetrafunctional epoxy resins), "N-690" (a cresol novolak-type epoxy resin), "N-695" (a cresol novolak-type epoxy resin), "HP-7200" (a dicyclopentadiene-type epoxy resin), and "HP-7200HH," "HP-7200H," "EXA7311," "EXA7311-G3," "XA7311-G4," "EXA7311-G4S," and "HP6000" (naphthylene ether-type epoxy resins) manufactured by DIC Corporation; "EPPN-502H" (a trisphenol-type epoxy resin), "NC7000L" (a naphthol novolak-type epoxy resin), "NC3000H," "NC3000," "NC3000L," and "NC3100" (biphenyl-type epoxy resins) manufactured by Nippon Kayaku Co., Ltd.; "ESN475V" (a naphthol-type epoxy resin) and "ESN485" (a naphthol novolak-type epoxy resin) manufactured by Nippon Steel & Sumikin Chemical Co., Ltd.; "YX4000H" and "YL6121" (biphenyl-type epoxy resins), "YX4000HK" (a bixylenol-type epoxy resin), and "YX8800" (an anthracene-type epoxy resin) manufactured by Mitsubishi Chemical Corporation; "PG-100" and "CG-500" manufactured by Osaka Gas Chemicals Co., Ltd.; "YL7800" (a fluorene-type epoxy resin) manufactured by Mitsubishi Chemical Corporation; and "jER1010" (a solid bisphenol A-type epoxy resin) and "jER1031S" (a tetraphenylethane-type epoxy resin) manufactured by Mitsubishi Chemical Corporation.

The liquid epoxy resin is preferably an aromatic epoxy resin that has two or more epoxy groups in one molecule and is liquid at a temperature of 20° C. The solid epoxy resin is preferably an aromatic epoxy resin that has three or more epoxy groups in one molecule and is solid at a temperature of 20° C. The aromatic epoxy resin referred to in the present invention means an epoxy resin having an aromatic ring structure in its molecule.

When the liquid epoxy resin and the solid epoxy resin are contained in combination as the epoxy resin, the amount ratio between them (the liquid epoxy resin to the solid epoxy resin) is preferably in the range of 1:0.1 to 1:5 in terms of mass ratio. By setting the amount ratio between the liquid epoxy resin and the solid epoxy resin to that range, the following effects can be obtained: i) moderate adhesion can be obtained when used in the form of the adhesive sheet; ii) sufficient flexibility can be obtained and handling improves when used in the form of the adhesive sheet; and iii) a hardened product having sufficient breaking strength can be obtained. In view of the effects of i) to iii), the amount ratio between the liquid epoxy resin and the solid epoxy resin (the liquid epoxy resin to the solid epoxy resin) is more preferably in the range of 1:0.3 to 1:4 and further preferably in the range of 1:0.6 to 1:3 in terms of mass ratio.

In view of obtaining the insulating layer exhibiting favorable mechanical strength and insulation reliability, the content of the epoxy resin in the resin composition is preferably 5% by mass or more, more preferably 9% by mass or more, and further preferably 13% by mass or more. The upper limit of the content of the epoxy resin, which is not limited to a particular content so long as the effects of the present invention are produced, is preferably 50% by mass or less and more preferably 40% by mass or less.

In the present invention, the contents of the respective components in the resin composition are values when the non-volatile component in the resin composition is 100% by mass unless otherwise specified.

The epoxy equivalent of the epoxy resin is preferably 50 to 5,000, more preferably 50 to 3,000, further preferably 80 to 2,000, and still further preferably 110 to 1,000. Being in this range makes the cross-linking density of the hardened product sufficient and can provide the insulating layer with small surface roughness. The epoxy equivalent can be measured in accordance with JIS K 7236 and is the mass of a resin containing one equivalent of epoxy group.

The weight average molecular weight of the epoxy resin is preferably 100 to 5,000, more preferably 250 to 3,000, and further preferably 400 to 1,500. The weight average molecular weight of the epoxy resin is a weight average molecular weight in terms of polystyrene measured by the gel permeation chromatography (GPC).

(b) Curing Agent

The curing agent is not limited to a particular curing agent so long as it has a function of curing the epoxy resin; examples thereof include a phenol-based curing agent, a naphthol-based curing agent, an activated ester-based curing agent, a benzoxazine-based curing agent, a cyanate ester-based curing agent, and a carbodiimide-based curing agent. One of the curing agents may be contained singly, or two or more of them may be contained in combination. Component (b) is preferably one or more selected from the phenol-based curing agent, the naphthol-based curing agent, the activated ester-based curing agent, and the cyanate ester-based curing agent.

In view of heat resistance and water resistance, the phenol-based curing agent and the naphthol-based curing agent are preferably a phenol-based curing agent having a novolak structure or a naphthol-based curing agent having a novolak structure. In view of adhesiveness with the wiring layer, a preferred one is a nitrogen-containing phenol-based curing agent, and a more preferred one is a triazine skeleton-containing phenol-based curing agent. In view of highly satisfying heat resistance, water resistance, and the adhesiveness with the wiring layer, a particularly preferred one is a triazine skeleton-containing phenol novolak curing agent.

Specific examples of the phenol-based hardener and the naphthol-based hardener include "MEH-7700," "MEH-7810," and "MEH-7851" manufactured by Meiwa Plastic Industries, Ltd; "NHN," "CBN," and "GPH" manufactured by Nippon Kayaku Co., Ltd.; "SN170," "SN180," "SN190," "SN475," "SN485," "SN495," "SN375," and "SN395" manufactured by Nippon Steel & Sumikin Chemical Co., Ltd.; and "LA7052," "LA7054," "LA3018," and "EXB-9500" manufactured by DIC Corporation.

In view of obtaining the insulating layer excellent in the adhesiveness with the wiring layer, the activated ester-based curing agent is also preferred. The activated ester-based curing agent is not limited to a particular activated ester-based curing agent; preferred examples thereof generally include compounds having two or more ester groups having high reaction activity in one molecule such as phenol esters, thiophenol esters, N-hydroxyamine esters, and esters of heterocyclic hydroxy compounds. The activated ester-based curing agent is preferably obtained by a condensation reaction of a carboxylic acid compound and/or a thiocarboxylic acid compound and a hydroxy compound and/or a thiol compound. In view of especially improving heat resistance, a preferred one is the activated ester-based curing agent obtained from the carboxylic acid compound and the hydroxy compound, and a more preferred one is the activated ester-based curing agent obtained from the carboxylic acid compound and a phenol compound and/or a naphthol compound. Examples of the carboxylic acid compound include benzoic acid, acetic acid, succinic acid, maleic acid, itaconic acid, phthalic acid, isophthalic acid, terephthalic acid, and pyromellitic acid. Examples of the phenol compound or the naphthol compound include hydroquinone, resorcin, bisphenol A, bisphenol F, bisphenol S, phenolphthalein, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, a dicyclopentadiene-type diphenol compound, and phenol novolak. The "dicyclopentadiene-type diphenol compound" refers to a diphenol compound obtained by causing two phenol molecules to condense with one dicyclopentadiene molecule.

Specifically, preferred ones are an activated ester compound containing a dicyclopentadiene-type diphenol structure, an activated ester compound containing a naphthalene structure, an activated ester compound containing acetylated product of a phenol novolak, and an activated ester compound containing a benzoylated product of phenol novolak. Among them, more preferred ones are the activated ester compound containing the naphthalene structure and the activated ester compound containing the dicyclopentadiene-type diphenol structure. The "dicyclopentadiene-type diphenol structure" represents a divalent structural unit containing phenylene-dicyclopentylene-phenylene.

Examples of the commercially available product of the activated ester-based hardener include "EXB9451," "EXB9460," "EXB9460S," and "HPC-8000-65T" (manufactured by DIC Corporation) as the activated ester compound containing the dicyclopentadiene-type diphenol structure; "EXB9416-70BK" (manufactured by DIC Corporation) as the activated ester compound containing the naphthalene structure; "DC808" (manufactured by Mitsubishi Chemical Corporation) as the activated ester compound containing the acetylated product of phenol novolak; "YLH1026" (manufactured by Mitsubishi Chemical Corporation) as the activated ester compound containing the benzoylated product of phenol novolak; "DC808" (manufactured by Mitsubishi Chemical Corporation) as the activated ester-based curing agent, which is the acetylated product of phenol novolak; "YLH1026" (manufactured by Mitsubishi Chemical Corporation), "YLH1030" (manufactured by Mitsubishi Chemical Corporation), and "YLH1048" (manufactured by Mitsubishi Chemical Corporation) as the activated ester-based hardener, which is the benzoylated product of phenol novolak.

Specific examples of the benzoxazine-based curing agent include "HFB2006M" manufactured by Showa Highpolymer Co., Ltd. and "P-d" and "F-a" manufactured by Shikoku Chemicals Corporation.

Examples of the cyanate ester-based curing agent include difunctional cyanate resins such as bisphenol A dicyanate, polyphenol cyanate, oligo(3-methylene-1,5-phenylenecyanate), 4,4'-methylenebis(2,6-dimethylphenyl cyanate), 4,4'-ethylidene diphenyl dicyanate, hexafluoro bisphenol A dicyanate, 2,2-bis(4-cyanate)phenylpropane, 1,1-bis(4-cyanatephenylmethane), bis(4-cyanate-3,5-dimethylphenyl) methane, 1,3-bis(4-cyanatephenyl-1-(methylethylidene)) benzene, bis(4-cyanatephenyl)thioether, and bis(4-cyanatephenyl)ether; polyfunctional cyanate resins derived from phenol novolak, cresol novolak, and the like; and prepolymers in which these cyanate resins are partially modified into triazine. Specific examples of the cyanate ester-based curing agent include "PT30" and "PT60" (both are phenol novolak-type polyfunctional cyanate ester resins), "BA230" and "BA230S75" (prepolymers as trimers of bisphenol A dicyanate part or the whole of which is modified into triazine) manufactured by Lonza Japan Ltd.

Specific examples of the carbodiimide-based curing agent include "V-03" and "V-07" manufactured by Nisshinbo Chemical Inc.

The amount ratio between the epoxy resin and the curing agent, which is the ratio of [the total number of epoxy groups of the epoxy resin]:[the total number of reactive groups of the curing agent], is preferably in the range of 1:0.01 to 1:2, more preferably 1:0.015 to 1:1.5, and further preferably 1:0.02 to 1:1. The reactive group of the curing agent is an activated hydroxide group, an activated ester group, or the like and differs by the type of the curing agent. The total number of epoxy groups of the epoxy resin is a value obtained by totaling a value obtained by dividing the solid content mass of each epoxy resin by the epoxy equivalent for all the epoxy resins. The total number of reactive groups of the curing agent is a value obtained by totaling a value obtained by dividing the solid content mass of each curing agent by a reactive group equivalent for all the curing agents. By setting the amount ratio between the epoxy resin and the curing agent to that range, the heat resistance of the hardened product of the resin composition further improves.

In an embodiment, the thermosetting resin composition contains (a) the epoxy resin and (b) the curing agent. The thermosetting resin composition preferably contains a mixture of the liquid epoxy resin and the solid epoxy resin (the mass ratio of the liquid epoxy resin to the solid epoxy resin is preferably 1:0.1 to 1:5, more preferably 1:0.3 to 1:4, and further preferably 1:0.6 to 1:3) as (a) the epoxy resin and one or more selected from the group consisting of the phenol-based curing agent, the naphthol-based curing agent, the activated ester-based curing agent, and the cyanate ester-based curing agent (preferably one or more selected from the group consisting of the activated ester-based curing agent and the cyanate ester-based curing agent) as (b) the curing agent.

The content of the curing agent in the thermosetting resin composition, which is not limited to a particular content, is preferably 30% by mass or less, more preferably 25% by mass or less, and further preferably 20% by mass or less. The lower limit, which is not limited to a particular content, is preferably 2% by mass or more.

(c) Inorganic Filler

The material of the inorganic filler is not limited to a particular material; examples thereof includes silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium titanate zirconate, barium zirconate, calcium zirconate, zirconium phosphate, and zirconium phosphate tungstate. Among them, a particularly preferred one is silica. Silica is preferably spherical silica. One of the inorganic fillers may be contained singly, or two or more of them may be contained in combination.

In view of favorable embeddability, the average particle diameter of the inorganic filler is preferably 2 μm or less, more preferably 1 μm or less, further preferably 0.8 μm or less, and still further preferably 0.6 μm or less. The lower limit of the average particle diameter, which is not limited to a particular value, is preferably 0.01 μm or more, more preferably 0.05 μm or more, and further preferably 0.1 μm or more. Examples of the commercially available product of the inorganic filler having such an average particle diameter include "YC100C," "YA050C," "YA050C-MJE," and "YA010C" manufactured by Admatechs Co., Ltd.; "UFP-30" manufactured by Denka Co., Ltd.; "Silfil NSS-3N," "Silfil NSS-4N," and "Silfil NSS-5N" manufactured by Tokuyama Corporation; and "SOC2" and "SOC1" manufactured by Admatechs Co., Ltd.

The average particle diameter of the inorganic filler can be measured by the laser diffraction and scattering method based on the Mie scattering theory. Specifically, the particle size distribution of the inorganic filler is created on a volume basis by a laser diffraction and scattering particle size distribution measuring apparatus, and its median diameter is measured as the average particle diameter. For a measurement sample, the inorganic filler dispersed in water through ultrasonic waves can be preferably used. Examples of the laser diffraction and scattering particle size distribution measuring apparatus include "LA-500" manufactured by Horiba Ltd.

In view of increasing humidity resistance and dispersibility, the inorganic filler is preferably treated with one or more surface treating agents such as an aminosilane-based coupling agent, an epoxysilane-based coupling agent, a mercaptosilane-based coupling agent, a silane-based coupling agent, an organosilazane compound, and a titanate-based coupling agent. Examples of the commercially available product of the surface treating agent include "KBM403" (3-glycidoxypropyltrimethoxysilane) manufactured by Shin-Etsu Chemical Co., Ltd., "KBM803" (3-mercaptopropyltrimethoxysilane) manufactured by Shin-Etsu Chemical Co., Ltd., "KBE903" (3-aminopropyltriethoxysilane) manufactured by Shin-Etsu Chemical Co., Ltd., "KBM573" (N-phenyl-3-aminopropyltrimethoxysilane) manufactured by Shin-Etsu Chemical Co., Ltd., "SZ-31" (hexamethyldisilazane) manufactured by Shin-Etsu Chemical Co., Ltd., "KBM103" (phenyltrimethoxysilane) manufactured by Shin-Etsu Chemical Co., Ltd., and "KBM-4803" (a long-chain epoxy-type silane coupling agent) manufactured by Shin-Etsu Chemical Co., Ltd.

The degree of surface treatment by the surface treating agent can be evaluated by the carbon amount per unit surface area of the inorganic filler. In view of increasing the dispersibility of the inorganic filler, the carbon amount per unit surface area of the inorganic filler is preferably $0.02$ m $g/m^2$ or more, more preferably $0.1$ mg/$m^2$ or more, and further preferably $0.2$ mg/$m^2$ or more. In view of preventing increases in the melt viscosity of the resin varnish and melt viscosity in the form of a sheet, the carbon amount per unit surface area of the inorganic filler is preferably $1$ mg/$m^2$ or less, more preferably $0.8$ mg/$m^2$ or less, and further preferably $0.5$ mg/$m^2$ or less.

The carbon amount per unit surface area of the inorganic filler can be measured after the inorganic filler after being subjected to the surface treatment is subjected to washing treatment with a solvent (methyl ethyl ketone (MEK), for example). Specifically, a sufficient amount of MEK as the solvent is added to the inorganic filler subjected to the surface treatment with the surface treating agent, which is then subjected to ultrasonic cleaning at 25° C. for 5 minutes. The supernatant liquid is removed, the solid content is dried, and the carbon amount per unit surface area of the inorganic filler can be measured using a carbon analyzer. Examples of the carbon analyzer include "EMIA-320V" manufactured by Horiba Ltd.

In view of obtaining the insulating layer with a low coefficient of thermal expansion, the content of the inorganic filler in the thermosetting resin composition is preferably 20% by mass or more and more preferably 30% by mass or more. In view of the mechanical strength, especially the elongation of the insulating layer, the upper limit of the content of the inorganic filler in the thermosetting resin composition is preferably 85% by mass or less and more preferably 80% by mass or less.

(d) Thermoplastic Resin

Examples of the thermoplastic resin include a phenoxy resin, a polyvinyl acetal resin, a polyolefin resin, a polybutadiene resin, a polyimide resin, a polyamideimide resin, a polyether imide resin, a polysulfone resin, a polyether sulfone resin, a polyphenylene ether resin, a polycarbonate resin, a polyether ether ketone resin, and a polyester resin. A preferred one is the phenoxy resin. One of the thermoplastic resins may be contained singly, or two or more of them may be contained in combination.

The weight average molecular weight in terms of polystyrene of the thermoplastic resin is preferably in the range of 8,000 to 70,000, more preferably in the range of 10,000 to 60,000, and further preferably in the range of 20,000 to 60,000. The weight average molecular weight in terms of polystyrene of the thermoplastic resin is measured by the gel permeation chromatography (GPC). Specifically, the weight average molecular weight in terms of polystyrene of the thermoplastic resin can be measured using LC-9A/RID-6A manufactured by Shimadzu Corporation as a measuring apparatus, Shodex K-800P/K-804L/K-804L manufactured by Showa Denko K.K. as a column, and chloroform or the like as a mobile phase at a column temperature of 40° C. and calculated using the calibration curve of the standard polystyrene.

Examples of the phenoxy resin include a phenoxy resin having a skeleton of at least one selected from the group consisting of a bisphenol A skeleton, a bisphenol F skeleton, a bisphenol S skeleton, a bisphenol acetophenone skeleton, a novolak skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethylcyclohexane skeleton. The terminal of the phenoxy resin may be any functional group such as a phenolic hydroxy group or an epoxy group. One of the phenoxy resins may be contained singly, or two or more of them may be contained in combination. Specific examples of the phenoxy resin include "1256" and "4250" (both are bisphenol A skeleton-containing phenoxy resins), "YX8100" (a bisphenol S skeleton-containing phenoxy resin), and "YX6954" (a bisphenol acetophenone skeleton-containing phenoxy resin) manufactured by Mitsubishi Chemical Corporation; "FX280" and "FX293" manufactured by Nippon Steel & Sumikin Chemical Co., Ltd.; and "YX6954BH30," "YX7553," "YX7553BH30," "YL7769BH30," "YL6794," "YL7213," "YL7290," and "YL7482" manufactured by Mitsubishi Chemical Corporation.

Examples of the polyvinyl acetal resin include a polyvinyl formal resin and a polyvinyl butyral resin, and a preferred one is the polyvinyl butyral resin. Specific examples of the polyvinyl acetal resin include "Denka Butyral 4000-2," "Denka Butyral 5000-A," "Denka Butyral 6000-C," and "Denka Butyral 6000-EP" manufactured by Denka Co., Ltd.; and Eslek BH Series and BX Series (BX-5Z, for example), KS Series (KS-1, for example), BL Series, and BM Series manufactured by Sekisui Chemical Co., Ltd.

Specific examples of the polyimide resin include "Rikacoat SN20" and "Rikacoat PN20" manufactured by New Japan Chemical Co., Ltd. Other specific examples of the polyimide resin include modified polyimides such as a linear polyimide obtained by reacting a difunctional hydroxy group-terminated polybutadiene, a diisocyanate compound, and a tetrabasic acid anhydride (the polyimide disclosed in Japanese Patent Application Laid-open No. 2006-37083, which is incorporated herein by reference in its entirety), and a polysiloxane skeleton-containing polyimide (the polyimide disclosed in Japanese Patent Application Laid-open No. 2002-12667 and Japanese Patent Application Laid-open No. 2000-319386, both of which are incorporated herein by reference in their entireties).

Specific examples of the polyamideimide resin include "Vylomax HR11NN" and "Vylomax HR16NN" manufactured by Toyobo Co., Ltd. Other specific examples of the polyamideimide resin include modified polyamideimides such as "KS9100" and "KS9300" (polysiloxane skeleton-containing polyamideimides) manufactured by Hitachi Chemical Company, Ltd.

Specific examples of the polyether sulfone resin include "PES5003P" manufactured by Sumitomo Chemical Co., Ltd.

Specific examples of the polysulfone resin include polysulfone "P1700" and "P3500" manufactured by Solvay Advanced Polymers.

Among them, the thermoplastic resin is preferably the phenoxy resin and the polyvinyl acetal resin. Consequently, in a preferred embodiment, the thermoplastic resin contains one or more selected from the group consisting of the phenoxy resin and the polyvinyl acetal resin.

When the thermosetting resin composition contains the thermoplastic resin, the content of the thermoplastic resin is preferably 0.5% by mass to 60% by mass, more preferably 3% by mass to 50% by mass, and further preferably 5% by mass to 40% by mass.

(e) Curing Promoter

Examples of the curing promoter include phosphorous-based curing promoters, amine-based curing promoters, imidazole-based curing promoter s, guanidine-based curing promoters, and metal-based curing promoters. Preferred ones are the phosphorous-based curing promoters, the amine-based curing promoters, the imidazole-based curing promoters, and the metal-based curing promoters. More preferred ones are the amine-based curing promoters, the imidazole-based curing promoters, and the metal-based curing promoters. One of the curing promoters may be contained singly, or two or more of them may be contained in combination.

Examples of the phosphorous-based curing promoter include triphenylphosphine, phosphonium borate compounds, tetraphenylphosphonium tetraphenyl borate, n-butylphosphonium tetraphenyl borate, tetrabutylphosphonium decanoate, (4-methylphenyl)triphenylphosphonium thiocyanate, tetraphenylphosphonium thiocyanate, and butyltriphenylphosphonium thiocyanate. Preferred ones are triphenylphosphine and tetrabutylphosphonium decanoate.

Examples of the amine-based curing promoter include trialkylamines such as triethylamine and tributylamine, 4-dimethylaminopyridine, benzyldimethylamine, 2,4,6-tris(dimethylaminomethyl)phenol, and 1,8-diazabicyclo(5,4,0)-undecene. Preferred ones are 4-dimethylaminopyridine and 1,8-diazabicyclo(5,4,0)-undecene.

Examples of the imidazole-based curing promoter include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline. Preferred ones are 2-ethyl-4-methylimidazole and 1-benzyl-2-phenylimidazole and adducts of imidazole compounds and epoxy resins.

The imidazole-based curing promoter may be a commercially available product; examples thereof include "P200-H50" manufactured by Mitsubishi Chemical Corporation.

Examples of the guanidine-based curing promoter include dicyandiamide, 1-methylguanidine, 1-ethylguanidine, 1-cyclohexylguanidine, 1-phenylguanidine, 1-(o-tolyl)guanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide. Preferred ones are dicyandiamide and 1,5,7-triazabicyclo[4.4.0]dec-5-ene.

Examples of the metal-based curing promoter include organic metal complexes or organic metal salts of metals such as cobalt, copper, zinc, iron, nickel, manganese, and tin. Specific examples of the organic metal complexes include organic cobalt complexes such as cobalt(II) acetylacetonate and cobalt(III) acetylacetonate; organic copper complexes such as copper(II) acetylacetonate; organic zinc complexes such as zinc(II) acetylacetonate; organic iron complexes such as iron(III) acetylacetonate; organic nickel complexes such as nickel(II) acetylacetonate; and organic manganese complexes such as manganese(II) acetylacetonate. Examples of the organic metal salts include zinc octanoate, tin octanoate, zinc naphthenate, cobalt naphthenate, tin stearate, and zinc stearate.

The content of the curing promoter in the thermosetting resin composition, which is not limited to a particular content, is preferably 0.01% by mass to 3% by mass with the total amount of the non-volatile components of the epoxy resin and the curing agent as 100% by mass.

(f) Flame Retardant

Examples of the flame retardant include organophosphorous-based flame retardants, organic nitrogen-containing phosphorous compounds, nitrogen compounds, silicone-based flame retardants, and metal hydroxides. One of the flame retardants may be contained singly, or two or more of them may be contained in combination.

The flame retardant may be a commercially available product; examples thereof include "HCA-HQ" manufactured by Sanko Co., Ltd.

When the thermosetting resin composition contains the flame retardant, the content of the flame retardant, which is not limited to a particular content, is preferably 0.5% by mass to 20% by mass, more preferably 0.5% by mass to 15% by mass, and further preferably 0.5% by mass to 10% by mass.

(g) Organic Filler

The thermosetting resin composition may contain any organic filler that can be used when the insulating layer of the print wiring board is formed; examples thereof include rubber particles, polyamide fine particles, and silicone particles.

The rubber particles may be commercially available products; examples thereof include "EXL-2655" manufactured by Dow Chemical Japan Ltd. and "AC3816N" manufactured by Ganz Chemical Co., Ltd.

When the thermosetting resin composition contains the organic filler, the content of the organic filler is preferably 0.1% by mass to 20% by mass, more preferably 0.2% by mass to 10% by mass, and further preferably 0.3% by mass to 5% by mass or 0.5% by mass to 3% by mass.

Other Components

The thermosetting resin composition may further contain other additives as needed; examples of the other additives include organic metal compounds such as organic copper compounds, organic zinc compounds, and organic cobalt compounds; and resin additives such as thickeners, antifoaming agents, leveling agents, adhesiveness imparting agents, and colorants.

In view of manufacturing a flexible wiring board, the thermosetting resin composition preferably further contains a polyimide resin having a polybutadiene structure, a urethane structure, and an imide structure in its molecule and a phenol structure in its molecular terminal. When the polyimide resin is contained, the content thereof is preferably 10% by mass to 85% by mass, more preferably 15% by mass to 50% by mass, and further preferably 20% by mass to 30% by mass.

For the details of the polyimide refer to the description of WO2008/153208, which is incorporated herein by reference in its entirety.

In view of thinning the wiring board, the thickness of the thermosetting resin composition layer is preferably 100 μm or less, more preferably 80 μm or less, further preferably 60 μm or less, and still further preferably 40 μm or less or 20 μm or less. The lower limit of the thickness of the thermosetting resin composition layer, which is not limited to a particular thickness, is preferably 2 μm or more and more preferably 5 μm or more.

In view of obtaining favorable wiring embeddability, the lowest melt viscosity of the thermosetting resin composition layer in the adhesive sheet is preferably 9,000 poise (900 Pa·s) or less, more preferably 8,000 poise (800 Pa·s) or less, and further preferably 4,000 poise (400 Pa·s) or less, 3,500 poise (350 Pa·s) or less, or 3,000 poise (300 Pa·s) or less. The lower limit of the lowest melt viscosity is preferably 100 poise (10 Pa·s) or more, more preferably 200 poise (20 Pa·s) or more, and further preferably 250 poise (25 Pa·s) or more, The lowest melt viscosity of the thermosetting resin composition layer refers to the lowest viscosity that the thermosetting resin composition layer exhibits when the resin of the thermosetting resin composition layer melts. Specifically, when the thermosetting resin composition layer is heated at a constant temperature rising rate to melt the resin, the melt viscosity decreases as the temperature rises in an early stage, and after that when some degree is passed, the melt viscosity increases as the temperature rises. The lowest melt viscosity refers to the minimum melt viscosity. The lowest melt viscosity of the thermosetting resin composition layer can be measured by a dynamic viscoelastic method and can be measured in accordance with a method described in Measurement of Lowest Melt Viscosity of Thermosetting Resin Composition Layer described below, for example.

(ii) Resin Film Layer

The adhesive sheet includes (ii) the resin film layer. In the present invention, using the adhesive sheet including the resin film layer can manufacture a flexible wiring board.

The resin film layer is not limited to a particular material so long as it can be bent to manufacture the flexible wiring board; examples of the material include polyimide, polyethylene terephthalate, polyethylene naphthalate, a liquid crystal polymer, polyphenylene sulfide, polyether ether ketone, polybenzimidazole, aramid, polyamideimide, and polyether imide.

The glass transition temperature of the resin film layer is preferably 150° C. or more, more preferably 170° C. or more, and further preferably 200° C. or more or 250° C. or more. The upper limit, which is not limited to a particular temperature, is generally 500° C. or less. The glass transition temperature of the resin film layer can be measured in accordance with the method described in JIS K 7179 and can be specifically measured using thermal mechanical analysis (TMA), dynamic mechanical analysis (DMA), or the like. Examples of the thermal mechanical analysis (TMA) include TMA-SS6100 (manufactured by Seiko Instruments Inc.) and TMA-8310 (manufactured by Rigaku Corporation), whereas examples of the dynamic mechanical analysis (DMA) include DMS-6100 (manufactured by Seiko Instruments Inc.). When the glass transition temperature is higher than a decomposition temperature, and the glass transition temperature is not actually observed, the decomposition temperature can be a standard in place of the glass transition temperature. The decomposition temperature referred to in this context can be defined by a temperature at which a mass reduction rate when measured in accordance with the method described in JIS K 7120 is 5%.

The coefficient of linear thermal expansion of the resin film layer is preferably 40 ppm/° C. or less, more preferably 30 ppm/° C. or less, and further preferably 20 ppm/° C. or less, 15 ppm/° C. or less, 10 ppm/° C. or less, or 5 ppm/° C.

or less. In view of practicality, the lower limit thereof is preferably −20 ppm/° C. or more, more preferably −15 ppm/° C. or more, and further preferably −10 ppm/° C. or more.

The surface of the resin film layer may be subjected to corona treatment, plasma treatment, or UV treatment. In a preferred embodiment, the surface of the resin film on the side bonding to (i) the thermosetting resin composition layer is subjected to the corona treatment, the plasma treatment, or the UV treatment. Using such a resin film can increase adhesion between the resin film layer and the thermosetting resin composition layer. The treatment conditions of the corona treatment, the plasma treatment, or the UV treatment may be determined as appropriate in accordance with the material of the resin film layer or the like. The surface of the resin film layer on the side bonding to (iii) the thermosetting resin composition layer may be subjected to the corona treatment, the plasma treatment, or the UV treatment.

The resin film layer may be a commercially available product; examples thereof include "Upilex" manufactured by Ube Industries, Ltd.; "Kapton" manufactured by Du Pont-Toray Co., Ltd.; "Pomiran" manufactured by Arakawa Chemical Industries, Ltd.; "Apical" manufactured by Kaneka Corporation; "Mictron" manufactured by Toray Industries, Inc. and "Aramika" manufactured by Asahi Kasei Corporation as aramid films; "Vecstar" manufactured by Kuraray Co., Ltd. and "Biac" manufactured by Japan Gore-Tex Inc. as liquid crystal polymers; and "Sumilite FS-1100C" as polyether ether ketone.

In view of thinning the wiring board, the thickness of the resin film layer is preferably 100 μm or less, more preferably 80 μm or less, and further preferably 60 μm or less, 40 μm or less, or 20 μm or less. The lower limit of the thickness of the resin film layer, which is not limited to a particular thickness, is preferably 1 μm or more and more preferably 2 μm or more in view of the mechanical strength of the wiring board.

(iii) Metallic Foil or Thermosetting Resin Composition Layer

The adhesive sheet may further include (iii) the metallic foil or the thermosetting resin composition layer. The adhesive sheet preferably includes (i) the thermosetting resin composition layer, (ii) the resin film layer, and (iii) the metallic foil or the thermosetting resin composition layer in this order.

Examples of the metallic foil include copper foil and aluminum foil. A preferred one is the copper foil. Examples of the copper foil include foil formed of a copper single metal and foil formed of an alloy of copper and other metals (such as tin, chromium, silver, magnesium, nickel, zirconium, silicon, and titanium). The metallic foil may be laminated foil in which two or more pieces of metallic foil are laminated.

The metallic foil may be formed with an adhesive layer on the side bonding to (ii) the resin film layer. The adhesive layer, which is not limited to a particular adhesive layer, may be a known adhesive or a gluing agent.

The thermosetting resin composition layer is similar to (i) the thermosetting resin composition layer, and the preferred range is also similar thereto.

In view of thinning the wiring board, the thickness of (iii) the metallic foil or the thermosetting resin composition layer is preferably 100 μm or less, more preferably 80 μm or less, and further preferably 60 μm or less, 40 μm or less, 20 μm or less, or 10 μm or less. The lower limit of the thickness, which is not limited to a particular thickness, can be usually 1 μm or more, 2 μm or more, 3 μm or more, or the like.

The adhesive sheet may include other layers in addition to the layers (i) to (iii). The adhesive sheet may include a protective film layer described below on the outermost surface, for example.

Method for Manufacturing Adhesive Sheet

A method for manufacturing an adhesive sheet is not limited to a particular method so long as the adhesive sheet including (i) the thermosetting resin composition layer and (ii) the resin film layer in order can be obtained. The following discloses an example of the method for manufacturing an adhesive sheet, the adhesive sheet including the layer (iii), the layer (iii) being the thermosetting resin composition layer. First, a resin varnish in which the thermosetting resin composition for (i) the thermosetting resin composition layer is dissolved in an organic solvent is prepared, and this resin varnish is applied to a protective film described below using a die coater or the like. The applied resin varnish is dried to form (i) the thermosetting resin composition layer and to obtain Laminate 1. Next, (ii) the resin film layer is laminated on (i) the thermosetting resin composition layer of Laminate 1 to obtain Laminate 2. Separately, a resin varnish in which the thermosetting resin composition for (iii) the thermosetting resin composition layer is dissolved in an organic solvent is prepared, and this resin varnish is applied to the protective film described below using a die coater or the like. The applied resin varnish is dried to form (iii) the thermosetting resin composition layer and to obtain Laminate 3. Laminate 2 and Laminate 3 are laminated on each other so that (ii) the resin film layer and (iii) the thermosetting resin composition layer can bond to each other to obtain the adhesive sheet. When the adhesive sheet in which the layer (iii) is the metallic foil is manufactured, Laminate 3' in which (ii) the resin film layer and (iii) the metallic foil are laminated on each other may be used. Laminate 1 and Laminate 3' are laminated on each other so that (i) the thermosetting resin composition layer and (ii) the resin film layer bond to each other to obtain the adhesive sheet.

Examples of the organic solvent include ketones such as acetone, methyl ethyl ketone (MEK), and cyclohexanone; acetate esters such as ethyl acetate, butyl acetate, cellosolve acetate, propylene glycol monomethylether acetate, and carbitol acetate; carbitols such as cellosolve and butyl carbitol; aromatic hydrocarbons such as toluene and xylene; and amide-based solvents such as dimethylformamide, dimethylacetamide (DMAc), and N-methylpyrrolidone. One of the organic solvents may be used singly, or two or more of them may be used in combination.

Drying may be performed by known methods such as heating and hot-air blowing. Although the drying condition is not limited to a particular condition, drying is performed so that the content of the organic solvent in the thermosetting resin composition layer will be 10% by mass or less and preferably 5% by mass or less. When the resin varnish containing 30% by mass to 60% by mass of the organic solvent is used, drying at 50° C. to 150° C. for 3 minutes to 15 minutes can form the thermosetting resin composition layer, for example, although the drying condition varies depending on the boiling point of the organic solvent in the resin varnish.

The protective film can be further laminated on the surface of (i) the thermosetting resin composition layer not bonding to (ii) the resin film layer (that is, the surface opposite to the resin film layer) and the surface of (ii) the resin film layer not bonding to (i) the thermosetting resin composition layer (that is, the surface opposite to the thermosetting resin composition layer). When the adhesive sheet includes (iii) the metallic foil or the thermosetting resin composition layer, the protective film can be further laminated on the surface of (iii) the metallic foil or the thermosetting resin composition layer not bonding to (ii) the resin film layer (that is, the surface opposite to the resin film layer) and the surface of (i) the thermosetting resin composition layer not bonding to (ii) the resin film layer. Laminating the protective film can prevent the adherence of dust to or flaws on the surfaces of the layers (i) and (ii) (or the surfaces of the layers (i) and (iii) when the layer (iii) is included). The adhesive sheet can be wound in a roll shape to be stored. When the adhesive sheet has the protective film, the protective film is peeled, whereby the adhesive sheet becomes available.

The protective film is preferably a film formed of a plastic material.

Examples of the plastic material include polyesters such as polyethylene terephthalate (hereinafter, it may be abbreviated as "PET") and polyethylene naphthalate (hereinafter, it may be abbreviated as "PEN"), polyolefins such as polyethylene and polypropylene, polycarbonate (hereinafter, it may be abbreviated as "PC"), acrylics such as polymethylmethacrylate (PMMA), cyclic polyolefins, triacetylcellulose (TAC), polyether sulfide (PES), polyether ketone, and polyimide. Among them, preferred ones are polyethylene terephthalate, polyethylene naphthalate, and polypropylene. Particularly preferred one is polyethylene terephthalate, which is inexpensive.

For the protective film, the surface bonding to (i) the thermosetting resin composition layer or (ii) the resin film layer ((i) the thermosetting resin composition layer or (iii) the metallic foil or the thermosetting resin composition layer when (iii) the metallic foil or the thermosetting resin composition layer is included) may be subjected to matte treatment or corona treatment.

For the protective film, a mold release layer-attached support having a mold release layer may be used on the surface bonding to (i) the thermosetting resin composition layer or (ii) the resin film layer ((iii) the metallic foil or the thermosetting resin composition layer when the layer (iii) is included). Examples of a mold release agent for use in the mold release layer of the mold release layer-attached support include one or more mold release agents selected from the group consisting of an alkyd resin, a polyolefin resin, a urethane resin, and a silicone resin. The mold release layer-attached support may be a commercially available product; examples thereof include "SK-1," "AL-5," and "AL-7," manufactured by Lintec Corporation and "Lumirror T6AM" manufactured by Toray Industries, Inc., which are PET films having a mold release layer with an alkyd resin-based mold release agent as a main component.

The thickness of the protective film, which is not limited to a particular thickness, is preferably in the range of 5 μm to 75 μm and more preferably in the range of 10 μm to 60 μm. When the mold release layer-attached support is used, the thickness of the entire mold release layer-attached support is preferably in that range.

For the adhesive sheet refer to the description of Japanese Patent Application Laid-open No. 2014-187091, which is incorporated herein by reference in its entirety.

The adhesive sheet of the present invention exhibits favorable embeddability. In an embodiment, when the adhesive sheet is laminated on a wiring layer-attached base, the adhesive sheet can be laminated on the wiring layer in a void-free manner. The embeddability can be measured in accordance with the method described in "(2-2) Observation of Embeddability" of Working Examples described below.

The adhesive sheet includes the resin film layer and thereby exhibits the property of being bendable even after being thermally cured. The elongation at break of the adhesive sheet after being thermally cured is preferably 2% or more, more preferably 3% or more, and further preferably 5% or more. The upper limit thereof, which is not limited to a particular value, is 10% or less. The measurement of the elongation at break can be measured in accordance with the method described in Measurement of Elongation at Break described below. The wiring board of the present invention is manufactured using such an adhesive sheet and can thereby be a flexible wiring board. It is noted that the elongation at break of the adhesive sheet after being thermally cured means the elongation at break of (i) the thermosetting resin composition layer of the adhesive sheet.

Method for Manufacturing Wiring Board

The method for manufacturing a wiring board of the present invention includes:

(1) preparing a wiring layer-attached base including a base and a wiring layer provided on at least one surface of the base, (2) laminating an adhesive sheet including (i) a thermosetting resin composition layer and (ii) a resin film layer on the wiring layer-attached base so that the wiring layer will be embedded in (i) the thermosetting resin composition layer and performing thermal curing to form an insulating layer, (3) forming via holes in the insulating layer, (4) forming a conductor layer, and (5) removing the base.

The following describes a method for manufacturing a wiring board when the adhesive sheet includes (iii) the metallic foil or the thermosetting resin composition layer in which (iii) the metallic foil or the thermosetting resin composition layer is the thermosetting resin composition layer as a first embodiment and a method for manufacturing a wiring board when the layer (iii) of the adhesive sheet is the metallic foil as a second embodiment; these do not limit the present invention.

1. First Embodiment

Process (1)

Process (1) is a process of preparing a wiring layer-attached base including a base and a wiring layer provided on at least one surface of the base. As FIG. 1 illustrates an example, this wiring layer-attached base 10 has first metallic layers 12 and second metallic layers 13, which are part of a base 11, on both surfaces of the base 11 and has a wiring layer 14 on the surface of the one second metallic layer 13 opposite to the surface on the base 11 side.

In the details of Process (1), a dry film (a photosensitive resist film) is laminated on the base, exposure is performed on a certain condition using a photomask, and development is performed to form a pattern dry film. The wiring layer is formed by electroplating with the developed pattern dry film as a plating mask, and the pattern dry film is then peeled.

Materials for use in the first and second metallic layers are not limited to a particular material. In a preferred embodiment, in view of cost, the ease of etching and peeling, and the like, the first and second metallic layers are preferably chromium, nickel, titanium, aluminum, zinc, gold, palladium, silver, or copper and more preferably copper.

The base is not limited to a particular base so long as Process (1) to Process (5) can be performed. Examples of the base include substrates such as a glass epoxy substrate, a metallic substrate, a polyester substrate, a polyimide substrate, a BT resin substrate, and a thermosetting polyphenylene ether substrate. A metallic layer such as copper foil may be formed on the surface of the substrate.

The dry film is not limited to a particular dry film so long as it is a photosensitive dry film formed of a photoresist composition and may be a dry film of a novolak resin, an acrylic resin, or the like. The dry film may be a commercially available product and may be "ALPHO 20A263" manufactured by Nikko-Materials Co., Ltd., which is a PET film-attached dry film, for example. The dry film may be laminated on one surface of the base or laminated on both surfaces of the base as in the third embodiment described below.

The lamination condition of the base and the dry film is similar to a condition when the adhesive sheet is laminated so as to be embedded in the wiring layer in Process (2) described below, and the preferred range is also similar thereto.

After laminating the dry film on the base, exposure and development are performed on a certain condition using a photomask in order to form a desired pattern on the dry film.

The line (a circuit width) and space (a width between circuits) ratio of the wiring layer, which is not limited to a particular ratio, is preferably 20/20 μm or less (that is, the pitch is 40 μm or less), more preferably 15/15 μm or less (the pitch is 30 μm or less), and further preferably 10/10 μm or less (the pitch is 20 μm or less). The lower limit of the line and space ratio of the wiring layer, which is not limited to a particular ratio, is preferably 0.5/0.5 μm or more and more preferably 1/1 μm or more. The pitch is not required to be the same across the entire wiring layer.

The minimum pitch of the wiring layer may be 40 μm or less, 30 μm or less, or 20 μm or less.

After forming the pattern of the dry film, the wiring layer is formed, and the dry film is peeled. The formation of the wiring layer can be performed by plating using the dry film formed with the desired pattern as a plating mask.

A conductor material for use in the wiring layer is not limited to a particular conductor material. In a preferred embodiment, the wiring layer contains one or more metals selected from the group consisting of gold, platinum, palladium, silver, copper, aluminum, cobalt, chromium, zinc, nickel, titanium, tungsten, iron, tin, and indium. The wiring layer may be a single metal layer or an alloy layer; examples of the alloy layer include a layer formed of an alloy of two or more metals selected from the group described above (a nickel-chromium alloy, a copper-nickel alloy, or a copper-titanium alloy, for example). Among them, in view of the versatility of the formation of the wiring layer, cost, the ease of patterning, and the like, preferred ones are the single metal layer of chromium, nickel, titanium, aluminum, zinc, gold, palladium, silver, or copper and the alloy layer of the nickel-chromium alloy, the copper-nickel alloy, or the copper-titanium alloy, more preferred ones are the single metal layer of chromium, nickel, titanium, aluminum, zinc, gold, palladium, silver, or copper and the alloy layer of the nickel-chromium alloy, and a further preferred one is the single metal layer of copper.

The thickness of the wiring layer, which depends on the design of a desired wiring board, is preferably 3 μm to 35 μm, more preferably 5 μm to 30 μM, and further preferably 10 μm to 20 μm or 15 μm.

After forming the wiring layer, the dry film is peeled. The peeling of the dry film can be performed using an alkaline peeling liquid such as a sodium hydroxide solution, for example. An unnecessary wiring pattern is removed by etching or the like as needed, whereby a desired wiring pattern can be formed. The pitch of the wiring layer to be formed is as described above.

Process (2)

Figure 2:
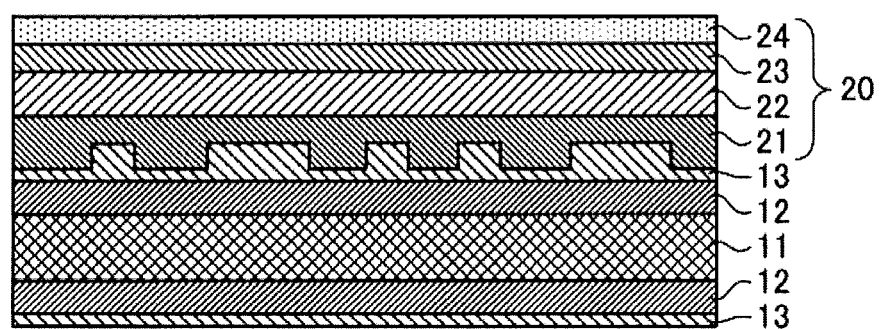
FIG. 2 is a schematic sectional view for illustrating a process of manufacturing the wiring board.

Process (2) is a process of laminating the adhesive sheet on the wiring layer-attached base so that the wiring layer will be embedded in (i) the thermosetting resin composition layer and performing thermal curing to form the insulating layer. The adhesive sheet of the present invention exhibits favorable embeddability, and when the adhesive sheet is laminated on the wiring layer-attached base, it can be laminated in a void-free manner. As FIG. 2 illustrates an example, the wiring layer 14 of the wiring layer-attached base obtained at Process (1) is laminated so as to be embedded in (i) a thermosetting resin composition layer 21 of an adhesive sheet 20, and (i) the thermosetting resin composition layer of the adhesive sheet 20 is thermally cured. The adhesive sheet 20 includes (i) the thermosetting resin composition layer 21, (ii) a resin film layer 22, and (iii) metallic foil or a thermosetting resin composition layer 23 laminated in this order. In other words, the adhesive sheet 20 has a structure having at least three layers. The adhesive sheet 20 may include a protective film 24 on the surface of (iii) the metallic foil or the thermosetting resin composition layer 23 opposite to the surface on the side having the resin film layer 22.

Although the adhesive sheet 20 used in the first embodiment has the three-layer structure, the adhesive sheet 20 is not limited thereto; the adhesive sheet 20 with a two-layer structure including (i) the thermosetting resin composition layer and (ii) the resin film layer laminated in this order may be used, for example. In this case, the layer (iii) 23 in the drawing is omitted.

First, as FIG. 2 illustrates an example, (i) the thermosetting resin composition layer 21 of the adhesive sheet 20 is laminated on the wiring layer-attached base so that the wiring layer 14 will be embedded therein.

The lamination of the wiring layer and the adhesive sheet can be performed by, after removing the protective film of the adhesive sheet, thermocompressing the adhesive sheet onto the wiring layer from the layer (iii) side, for example. Examples of a member for thermocompressing the adhesive sheet onto the wiring layer (hereinafter, also referred to as a "thermocompressing member") include a heated metallic plate (a SUS panel, for example) and a metallic roll (a SUS roll). Not directly pressing the thermocompressing member onto the adhesive sheet, pressing is preferably performed via an elastic member such as heat-resistant rubber so that the adhesive sheet will sufficiently follow the surface irregularities of the wiring layer.

The lamination of the wiring layer and the adhesive sheet may be performed by vacuum lamination after removing the protective film of the adhesive sheet. In the vacuum lamination, the thermocompressing temperature is preferably in the range of 60° C. to 160° C. and more preferably 80° C. to 140° C. The thermocompressing pressure is preferably in the range of 0.098 MPa to 1.77 MPa and more preferably 0.29 MPa to 1.47 MPa. The thermocompressing time is preferably in the range of 20 seconds to 400 seconds and more preferably 30 seconds to 300 seconds. The lamination is preferably performed in a reduced pressure condition with a pressure of 13 hPa or less.

The lamination can be performed by a commercially available vacuum laminator. Examples of the commercially available laminator include a vacuum pressurizing laminator manufactured by Nikko-Materials Co., Ltd., a vacuum pressurizing laminator manufactured by Meiki Co., Ltd., and a vacuum applicator manufactured by Nikko-Materials Co., Ltd.

After the lamination, flattening treatment on the laminated adhesive sheet may be performed by pressing the thermocompressing member from the layer (iii) side, for example, under normal pressure (under atmospheric pressure). The pressing condition of the flattening treatment can be similar to the thermocompressing condition of the lamination. The flattening treatment can be performed by a commercially available laminator. The lamination and the flattening treatment may be performed successively using the commercially available vacuum laminator.

After laminating the wiring layer on the wiring layer-attached base so as to be embedded in (i) the thermosetting resin composition layer, (i) the thermosetting resin composition layer is thermally cured to form the insulating layer. The thermal curing condition of (i) the thermosetting resin composition layer is not limited to a particular condition and may use a condition normally employed when the insulating layer of the wiring board is formed. In the first embodiment, when the layer (iii) is present, the layer (iii) is also the insulating layer.

The thermal curing condition of the thermosetting resin composition layer, which varies depending on the type of the thermosetting resin composition or the like, can include a curing temperature being in the range of 120° C. to 240° C. (preferably in the range of 150° C. to 220° C. and more preferably in the range of 170° C. to 200° C.) and a curing time being in the range of 5 minutes to 120 minutes (preferably 10 minutes to 100 minutes and more preferably 15 minutes to 90 minutes), for example.

Before thermal curing the thermosetting resin composition layer, the thermosetting resin composition layer may be preliminarily heated at a temperature lower than the curing temperature. Prior to thermosetting the thermosetting resin composition layer, the thermosetting resin composition layer may be preliminarily heated at a temperature of 50° C. or more and less than 120° C. (preferably 60° C. or more and 110° C. or less and more preferably 70° C. or more and 100° C. or less) for 5 minutes or more (preferably 5 minutes to 150 minutes and more preferably 15 minutes to 120 minutes), for example.

The protective film of the adhesive sheet may be peeled after the adhesive sheet is laminated on the wiring layer-attached base and is thermally cured, or the protective film may be peeled before the adhesive sheet is laminated on the wiring layer-attached base. Alternatively, the protective film may be peeled after Process (3) and before a roughening treatment process.

The thickness of the insulating layer is similar to the thickness of (i) the thermosetting resin composition layer or the thickness of the layer (iii), and the preferred range is also similar thereto.

Process (3)

Figure 3:
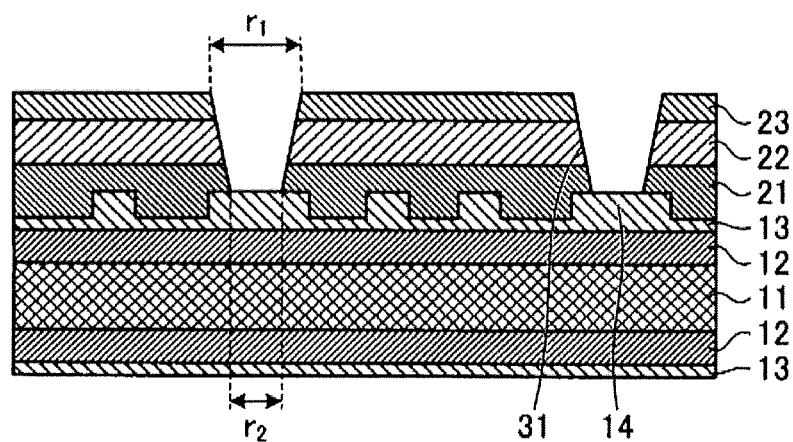
FIG. 3 is a schematic sectional view for illustrating a process of manufacturing the wiring board.

Process (3) is a process of forming via holes in the insulating layer. The formation of the via holes is preferably performed by laser irradiation. Specifically, as FIG. 3 illustrates an example, Process (3), after peeling the protective film 24, performs laser irradiation from the adhesive sheet 20 side to form via holes 31 that pass through an insulating layer 23, the resin film layer 22, and an insulating layer 21 and exposes the wiring layer 14. Before the protective film 24 is peeled, laser irradiation may be performed from the adhesive sheet side to form the via holes 31 that pass through the protective film 24, the insulating layer 23, the resin film layer 22, and the insulating layer 21 and exposes the wiring layer 14, and the protective film 24 may be peeled after the formation of the via holes 31.

This laser irradiation can be performed using any suitable laser processing machine using a $CO_2$ laser, a YAG laser, an excimer laser, or the like as a light source. Examples of the laser processing machine that can be used include a $CO_2$ laser processing machine "LC-2k212/2c" manufactured by Via Mechanics, 605GTWIII(-P) manufactured by Mitsubishi Electric Corporation, and a laser processing machine manufactured by Matsushita Welding Systems Co., Ltd.

The condition of the laser irradiation is not limited to a particular condition, and the laser irradiation can be performed by any suitable process following a usual method corresponding to the selected means.

The shape of the via holes, that is, the shape of the contour of an opening when viewed in the extending direction, which is not limited to a particular shape, is generally circular (substantially circular). In the following description, the "diameter" of the via hole refers to the diameter of the contour of the opening when viewed in the extending direction. In the present specification, a top diameter refers to the diameter of the contour of the via hole on the insulating layer 23 side, whereas a bottom diameter refers to the diameter of the contour of the via hole on the wiring layer 14 side.

The via holes are preferably formed so that a top diameter $r1$ of the via hole will be 120 μm or less and more preferably 90 μm or less.

The via holes are preferably formed so that the top diameter $r1$ of the via hole will be larger than a bottom diameter $r2$ of the via hole 31.

Setting so makes the embeddability of the via holes favorable, can prevent the occurrence of voids, and can consequently improve the reliability of electrical connection by filled vias described below.

After forming the via holes, what is called a desmear process, or a process of removing smears within the via holes, may be performed. When Process (4) described below is performed by a plating process, a wet desmear process may be performed on the via holes, for example. When Process (4) is performed by a sputtering process, a dry desmear process such as a plasma treatment process may be performed, for example. The desmear process may also serve as a roughening treatment process.

Before Process (4) a process of forming the conductor layer, a process of performing roughening treatment may be included. The roughening treatment is performed on the via holes and the adhesive sheet. The procedure and condition of the roughening treatment are not limited to a particular procedure and condition. A known procedure and condition normally used when the insulating layer of a multilayer print wiring board is formed can be employed, for example. Examples of dry roughening treatment include plasma treatment, whereas examples of wet roughening treatment include a method that performs swelling treatment with a swelling liquid, roughening treatment with an oxidizer, and neutralizing treatment with a neutralizing liquid in this order.

In the wet roughening treatment, the swelling treatment with the swelling liquid, the roughening treatment with the oxidizer, and the neutralizing treatment with the neutralizing liquid are performed in this order, whereby the insulating layer 23 can be subjected to the roughening treatment, for example. The swelling liquid is not limited to a particular swelling liquid; examples thereof include an alkaline solution and a surfactant solution, and a preferred one is the alkaline solution. More preferred examples of the alkaline solution include a sodium hydroxide solution and a potassium hydroxide solution. Examples of commercially available swelling liquids include Swelling Dip Securiganth P and Swelling Dip Securiganth SBU manufactured by Atotech Japan K.K.

The swelling treatment with the swelling liquid, which is not limited to particular treatment, can be performed by immersing the insulating layer 23 in the swelling liquid at 30° C. to 90° C. for 1 minute to 20 minutes, for example. In view of reducing the swelling of the resin of the insulating layer 23 to a moderate level, the insulating layer 23 is preferably immersed in the swelling liquid at 40° C. to 80° C. for 5 seconds to 15 minutes. The oxidizer is not limited to a particular oxidizer; examples thereof include an alkaline permanganic acid solution in which potassium permanganate or sodium permanganate is dissolved in an aqueous sodium hydroxide solution. The roughening treatment with the oxidizer such as the alkaline permanganic acid solution is preferably performed by immersing the insulating layer 23 in an oxidizer solution heated at 60° C. to 80° C. for 10 minutes to 30 minutes. The concentration of the permanganate in the alkaline permanganic acid solution is preferably 5% by mass to 10% by mass. Examples of commercially available oxidizers include alkaline permanganate acid solutions such as "Concentrate Compact P" and "Dosing Solution Securiganth P" manufactured by Atotech Japan K.K. The neutralizing liquid is preferably an acid aqueous solution; examples of the commercially available product thereof include "Reduction Solution Securiganth P" manufactured by Atotech Japan K.K.

The treatment with the neutralizing liquid can be performed by immersing a treated surface subjected to the roughening treatment with the oxidizer solution in the neutralizing liquid at 30° C. to 80° C. for 5 minutes to 30 minutes. In view of workability and the like, a method is preferably employed that immerses an object subjected to the roughening treatment with the oxidizer solution in the neutralizing liquid at 40° C. to 70° C. for 5 minutes to 20 minutes.

Process (4)

Process (4) is a process of forming the conductor layer. A conductor material contained in the conductor layer is not limited to a particular material. In a preferred embodiment, the conductor layer can be formed of the same material as the conductor material for use in the wiring pattern; the material is preferably copper.

The conductor layer may have a single-layer structure or have a multilayer structure in which two or more single-metal layers or alloy layers formed of different kinds of metals or alloys are laminated. When the conductor layer has the multilayer structure, the layer in contact with the insulating layer is preferably a single-metal layer formed of chromium, zinc, or titanium or an alloy layer formed of a nickel-chromium alloy.

The thickness of the conductor layer, which depends on the design of a desired wiring board, is generally 3 μm to 35 μm and preferably 5 μm to 30 μm.

The conductor layer can be formed by any known suitable method such as plating, sputtering, or vapor deposition and is preferably formed by plating. In a preferred embodiment, the surface of the insulating layer is plated by any known technique such as a semi-additive process or a full-additive process, and the conductor layer having a desired wiring pattern can be formed, for example.

Specifically, a plating seed layer is formed on the surface of the insulating layer 23 (the surface of the resin film layer 22 when the layer (iii) is absent) by electroless plating. Next, a mask pattern that exposes part of the plating seed layer in accordance with the desired wiring pattern is formed on the formed plating seed layer. After forming an electroplated layer on the exposed plating seed layer by electroplating, the mask pattern is removed. Subsequently, an unnecessary plating seed layer is removed by etching or the like, whereby the conductor layer having the desired wiring pattern can be formed.

Figure 4:
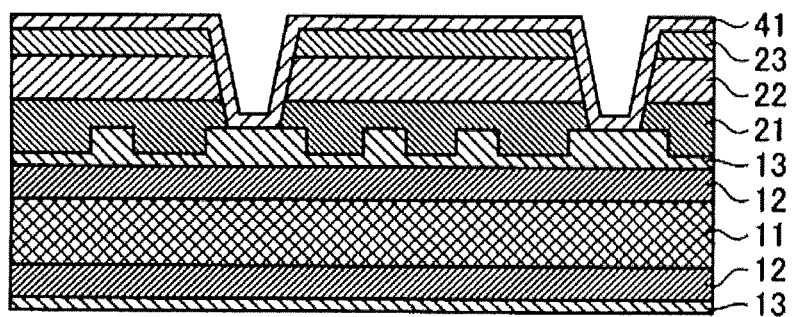
FIG. 4 is a schematic sectional view for illustrating a process of manufacturing the wiring board.

As FIG. 4 illustrates an example, a plating seed layer 41 bonding to the surface of the exposed insulating layer 23 (the surface of the resin film layer 22 when the layer (iii) is absent, hereinafter the same) is formed. First, alkaline cleaning for the cleaning and electric charge adjustment of the surface of the insulating layer 23 is performed. Next, a soft etching process for the cleaning of the inside of the via holes 31 is performed. Specifically, treatment may be performed on any suitable condition using an etchant such as a sulfuric acid-acidic aqueous sodium peroxodisulfate solution. Next, a predip process that adjusts electric charges on the surface of the insulating layer 23 to impart Pd (palladium) to the surface of the insulating layer 23 is performed. Next, Pd as an activator is imparted to the surface, and Pd imparted to the insulating layer 23 is reduced. Next, copper (Cu) is deposited on the surface of the insulating layer 23 to form the plating seed layer 41. In this process, the plating seed layer 41 is formed so as to cover the inside of the via holes 31, that is, side walls and the wiring pattern 14 exposed out of the via holes 31.

Figure 5:
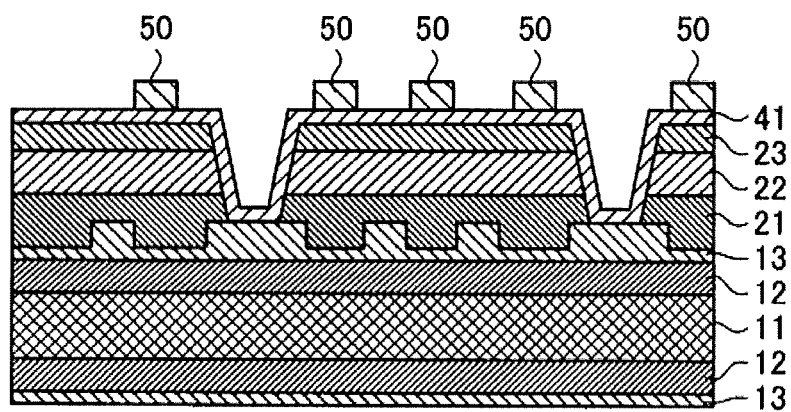
FIG. 5 is a schematic sectional view for illustrating the process of manufacturing the wiring board.

As FIG. 5 illustrates an example, after forming the plating seed layer 41, a mask pattern 50 that exposes part of the plating seed layer 41 is formed. The formation of the mask pattern 50 can be formed by bonding a dry film to the plating seed layer 41 and performing exposure, development, and rinsing on certain conditions, for example.

The dry film that can be used in Process (4) is similar to the dry film, and the preferred range is also similar thereto.

Figure 6:
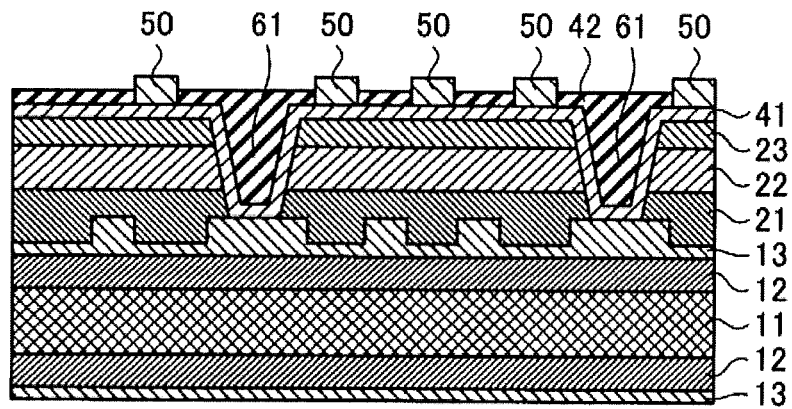
FIG. 6 is a schematic sectional view for illustrating the process of manufacturing the wiring board.

As FIG. 6 illustrates an example, an electroplated layer 42 is formed on the exposed plating seed layer 41 by electroplating treatment on the condition that the via holes 31 are filled, and at the same time, the via holes are filled by the electroplating treatment to form filled vias 61.

Figure 7:
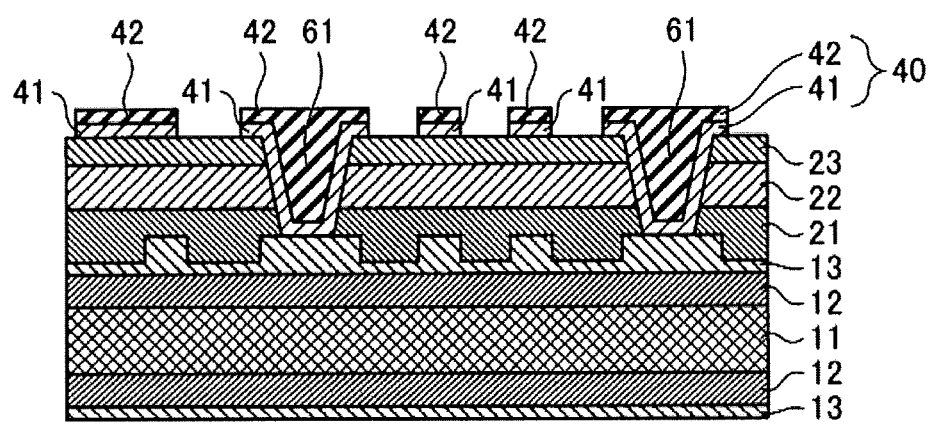
FIG. 7 is a schematic sectional view for illustrating the process of manufacturing the wiring board.

As FIG. 7 illustrates an example, the mask pattern is then peeled and removed, and flash etching on any suitable condition that removes only the exposed plating seed layer 41 is performed to form a pattern conductor layer 40.

The conductor layer can include not only linear wiring but also an electrode pad (land) on which an external terminal can be mounted, for example. The conductor layer may include only the electrode pad.

The conductor layer may be formed by, after forming the plating seed layer, forming the electroplated layer and the filled vias without using the mask pattern and then performing patterning by etching.

Process (5)

Figure 8:
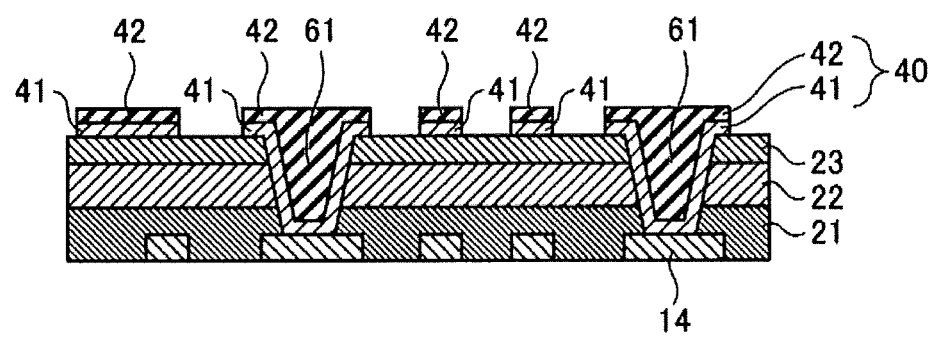
FIG. 8 is a schematic sectional view for illustrating a process of manufacturing the wiring board.

Process (5) is a process of removing the base as FIG. 8 illustrates an example and forming the wiring board of the present invention. The method for removing the base is not limited to a particular method. In a preferred embodiment, the base is peeled from the wiring board at an interface between the first and second metallic layers, and the second metallic layer is removed by etching with an aqueous copper chloride solution, for example.

The base may be peeled with the conductor layer 40 protected by a protective film as needed. The protective film is similar to the protective film for use in the adhesive sheet, and the preferred range is also similar thereto.

The method of manufacture of the present invention described above can manufacture a wiring board in which the wiring layer 14 is embedded in the insulating layer 21. At least one resin film layer 22 is included, whereby a flexible wiring board can be obtained. The formation of the insulating layer and the conductor layer at Process (2) to Process (4) may be repeatedly performed to form a multi-layer wiring board as needed. When the multilayer wiring board is manufactured, at least one adhesive sheet having the resin film layer may be used. In other words, the wiring board of the present invention may include at least one resin film layer even for the multilayer wiring board. Being flexible refers to the capability of bending the wiring board at least once without causing any crack and resistance value change.

2. Second Embodiment

The second embodiment is a method for manufacturing a wiring board when the layer (iii) of the adhesive sheet is the metallic foil. In the drawings referred to in the following description, components similar to those of the first embodiment will be denoted by the same symbols, and a duplicate description may be omitted.

Figure 9:
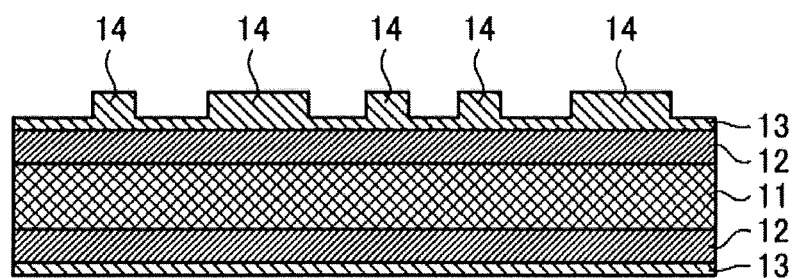
FIG. 9 is a schematic sectional view for illustrating a process of manufacturing the wiring board.

As FIG. 9 illustrates an example, Process (1) is a process of preparing the wiring layer-attached base including the base and the wiring layer provided on one surface of the base. A method for forming the wiring layer 14 is similar to that of the first embodiment.

Figure 10:
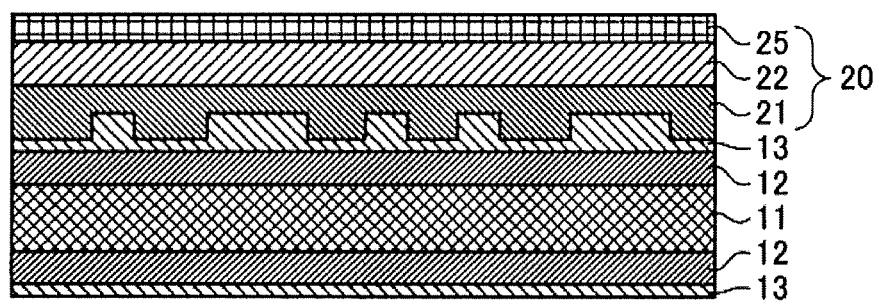
FIG. 10 is a schematic sectional view for illustrating a process of manufacturing the wiring board.

Process (2) is a process of laminating the adhesive sheet on the wiring layer-attached base so that the wiring layer will be embedded in (i) the thermosetting resin composition layer and performing thermal curing. As FIG. 10 illustrates an example, the wiring layer 14 of the wiring layer-attached base obtained at Process (1) is laminated so as to be embedded in (i) the thermosetting resin composition layer 21 of an adhesive sheet 20, and (i) the thermosetting resin composition layer of the adhesive sheet 20 is thermoset. The adhesive sheet 20 includes (i) the thermosetting resin composition layer 21, (ii) the resin film layer 22, and (iii) metallic foil 25 laminated in this order. The adhesive sheet 20 may include the protective film 24 on the surface of (iii) the metallic foil 25 opposite to the surface on the side having the resin film layer 22.

Figure 11:
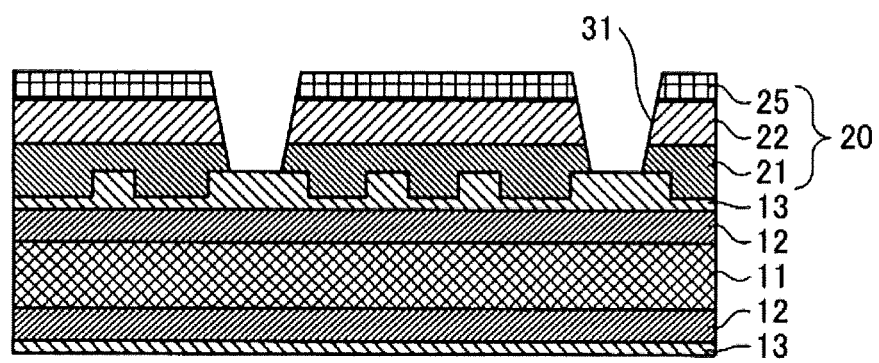
FIG. 11 is a schematic sectional view for illustrating a process of manufacturing the wiring board.

As FIG. 11 illustrates an example, Process (3) preferably performs laser irradiation from the thermally cured adhesive sheet 20 side to form the via holes 31 in the thermoset adhesive sheet 20. After ending Process (3), roughening treatment is performed.

Process (4) is a process of forming the conductor layer. In the second embodiment, the layer (iii) of the adhesive sheet is the metallic foil, and the conductor layer having a desired wiring pattern is preferably formed by a known technique such as a subtractive process.

In a preferred embodiment of Process (4), first, an etching resist pattern that exposes part of the metallic foil in accordance with the desired wiring pattern is formed on the surface of the metallic foil. The formation of the etching resist pattern can be formed by bonding an etching resist film to the metallic foil and performing exposure and development on certain conditions, for example.

After forming the etching resist pattern, the exposed metallic foil part is removed by etching or the like, and the etching resist pattern is then peeled and removed, whereby a conductor layer 43 having the desired wiring pattern can be formed.

The etching resist film may be one similar to the dry film, and the preferred range is also similar thereto.

Figure 12:
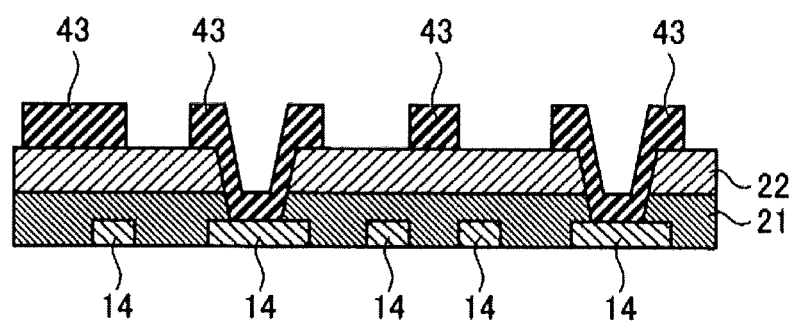
FIG. 12 is a schematic sectional view for illustrating a process of manufacturing the wiring board.

As FIG. 12 illustrates an example, Process (5) is a process of removing the base and forming the wiring board of the present invention.

3. Third Embodiment

The first embodiment and the second embodiment manufacture the wiring board from the wiring layer-attached base including the wiring layer on one surface, whereas a third embodiment is similar to the first embodiment and the second embodiment except that the wiring board is manufactured from the wiring layer-attached base including the wiring layers on both surfaces of the base. In the drawings referred to in the following description, similar components will be denoted by the same symbols, and a duplicate description may be omitted.

Figure 13:
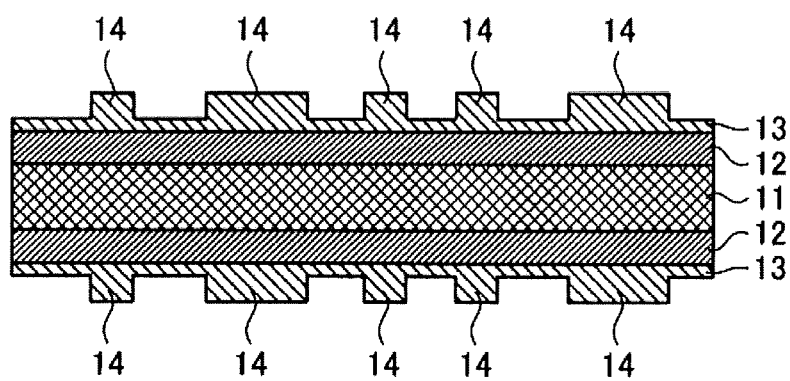
FIG. 13 is a schematic sectional view for illustrating a process of manufacturing the wiring board.

As FIG. 13 illustrates an example, Process (1) is a process of preparing the wiring layer-attached base including the base and wiring layers provided on both surfaces of the base. A method for forming the wiring layer 14 is similar to that of the first embodiment and the second embodiment. The wiring layers provided on both surfaces of the base may be formed simultaneously to prepare the wiring layer-attached base, or after forming one wiring layer, the other wiring layer may be formed to prepare the wiring layer-attached base. The wiring layers may have the same pattern or different patterns.

Figure 14:
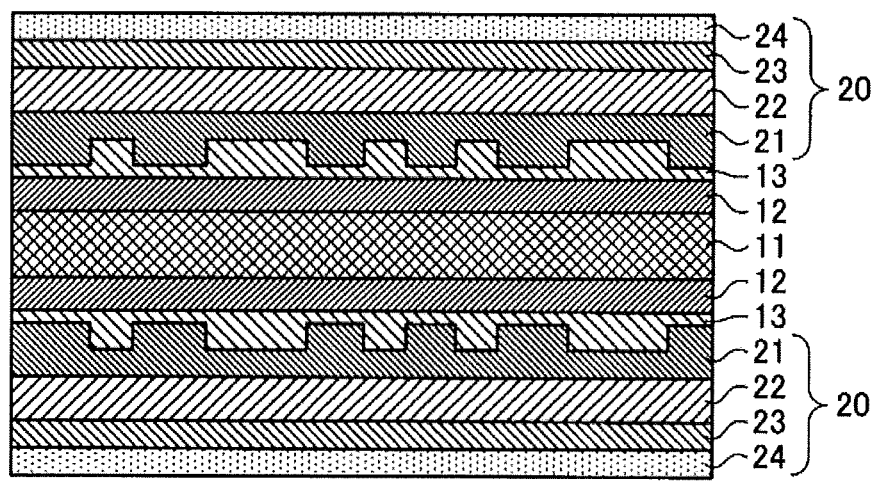
FIG. 14 is a schematic sectional view for illustrating a process of manufacturing the wiring board.

As FIG. 14 illustrates an example, Process (2) is a process of laminating adhesive sheets on the wiring layer-attached base so that the wiring layers will be embedded in (i) the thermosetting resin composition layer on both surfaces of the wiring layer-attached base and performing thermal curing. The two adhesive sheets used may be the same adhesive sheet or different adhesive sheets.

Figure 15:
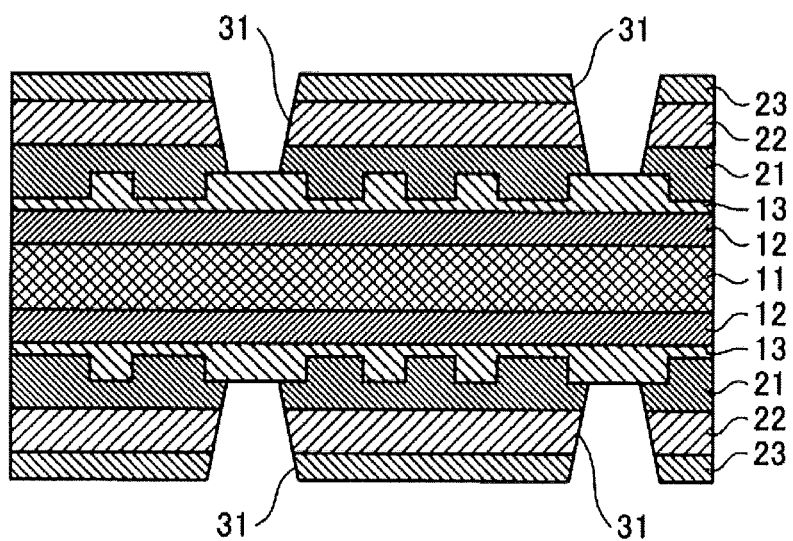
FIG. 15 is a schematic sectional view for illustrating a process of manufacturing the wiring board.

As FIG. 15 illustrates an example, Process (3) preferably performs laser irradiation from the thermally cured adhesive sheet side on both surfaces of the wiring layer-attached base to form the via holes in the thermally cured adhesive sheet. The formation of the via holes may be formed simultaneously, or after forming the via holes on one side, the via holes on the other side may be formed.

Before Process (4), a process of performing roughening treatment on both surfaces of the wiring layer-attached base may be included, which performs roughening treatment on the surfaces of the two insulating layers 23. The pieces of roughening treatment may be simultaneously performed, or after one piece of roughening treatment, the other piece of roughening treatment may be performed.

Figure 16:
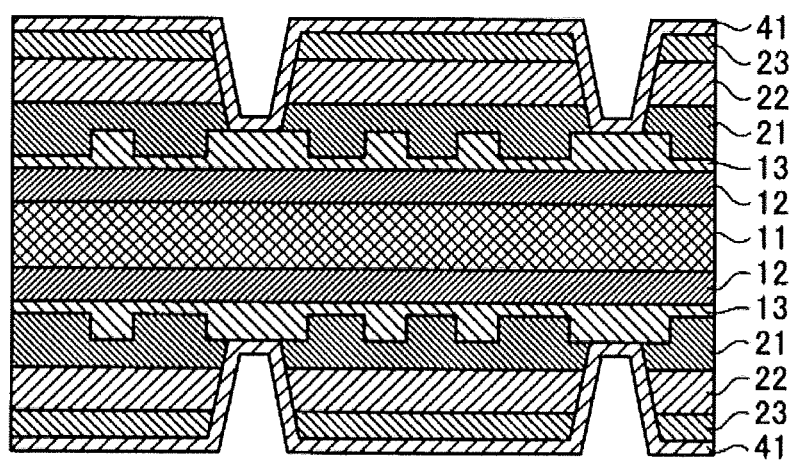
FIG. 16 is a schematic sectional view for illustrating a process of manufacturing the wiring board.
Figure 17:
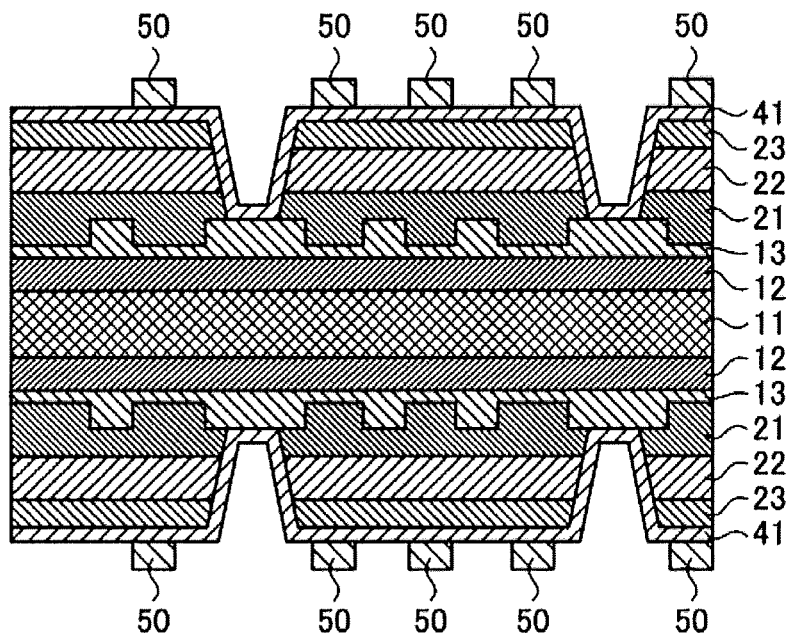
FIG. 17 is a schematic sectional view for illustrating the process of manufacturing the wiring board.
Figure 18:
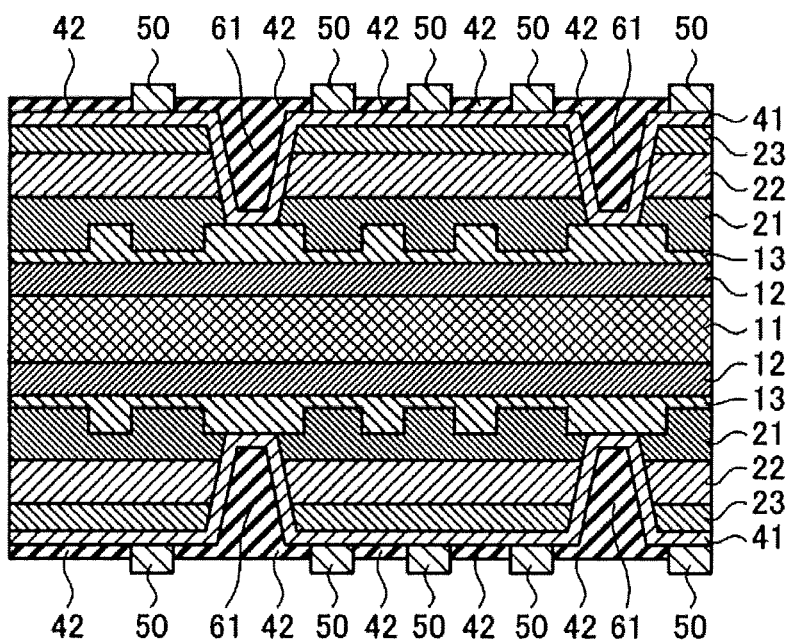
FIG. 18 is a schematic sectional view for illustrating the process of manufacturing the wiring board.
Figure 19:
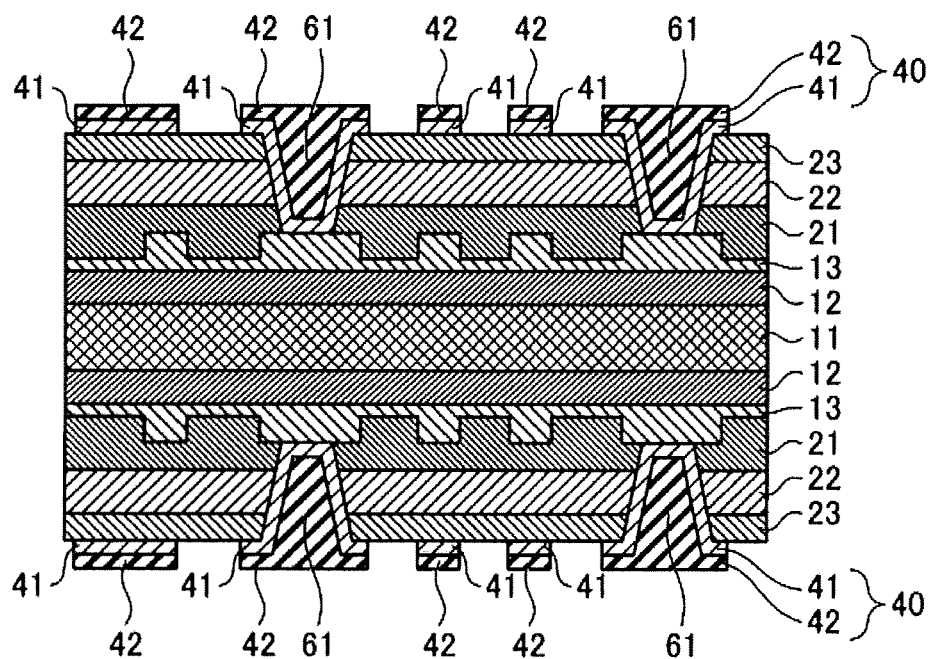
FIG. 19 is a schematic sectional view for illustrating the process of manufacturing the wiring board.

Process (4) forms the conductor layers on both surfaces of the wiring layer-attached base. As FIG. 16 illustrates an example, the plating seed layer 41 is formed on the insulating layer 23 after the roughening treatment. After forming the plating seed layer 41, the mask pattern 50 that exposes part of the plating seed layer 41 is formed as FIG. 17 illustrates an example, the electroplated layer 42 is formed on the exposed plating seed layer 41 as FIG. 18 illustrates an example, and at the same time, the via holes are filled by electroplating treatment to form the filled vias 61. As FIG. 19 illustrates an example, the mask pattern is removed to form the conductor layers. The details of the formation of the conductor layers can be performed similarly to the first embodiment. The two conductor layers may be formed at the same time, or after forming one conductor layer, the other conductor layer may be formed.

When the layer (iii) of the adhesive layer is the metallic foil, the conductor layers may be formed by a method similar to that of the second embodiment. One conductor layer may be formed similarly to the first embodiment, whereas the other conductor layer may be formed similarly to the second embodiment.

Figure 20:
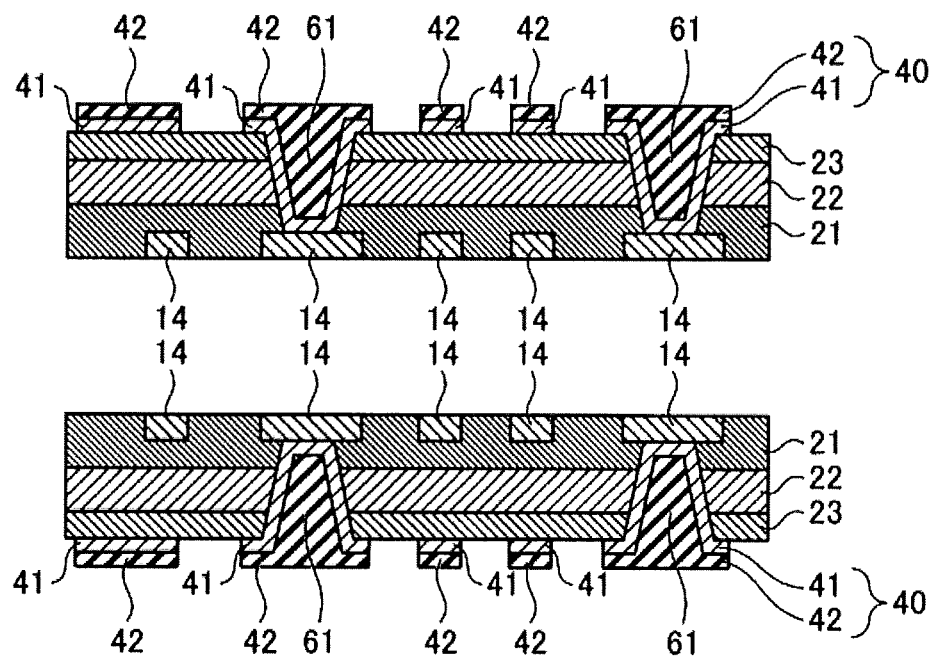
FIG. 20 is a schematic sectional view for illustrating a process of manufacturing the wiring board.

As FIG. 20 illustrates an example, Process (5) is a process of removing the base and forming the wiring board of the present invention. The third embodiment can simultaneously manufacture two kinds of wiring boards.

Wiring Board

The wiring board of the present invention includes the resin film layer, the insulating layer, and an embedded-type wiring layer embedded in the insulating layer. A description duplicate with the details described above may be omitted.

The wiring board of the present invention can be manufactured by the method for manufacturing a wiring board of the present invention including Processes (1) to (5), for example. As described above, as FIG. 8 and FIG. 20 illustrate examples, the wiring board of the present invention laminates the embedded-type wiring layer 14, the insulating layer 21, and the resin film layer 22 in this order. The insulating layer 23 and the conductor layer 40 are included on the surface of the resin film layer 22 not bonding to the insulating layer (that is, on the surface opposite to the resin film layer 22). The embedded-type wiring layer 14 bonds to the conductor layer 40 via the filled vias 61. As FIG. 12 illustrates an example, the conductor layer 43 and the embedded-type wiring layer 14 may bond to each other.

The embedded-type wiring layer refers to a wiring layer (the wiring layer 14) embedded in the insulating layer 21 so long as conductor connection with a component such as a semiconductor chip is enabled. The embedded-type wiring layer is normally embedded in the insulating layer so that its protruding height will be substantially 0 (zero), or normally −1 μm to +1 μm on the surface opposite to the side on which the adhesive sheet is laminated.

Figure 21:
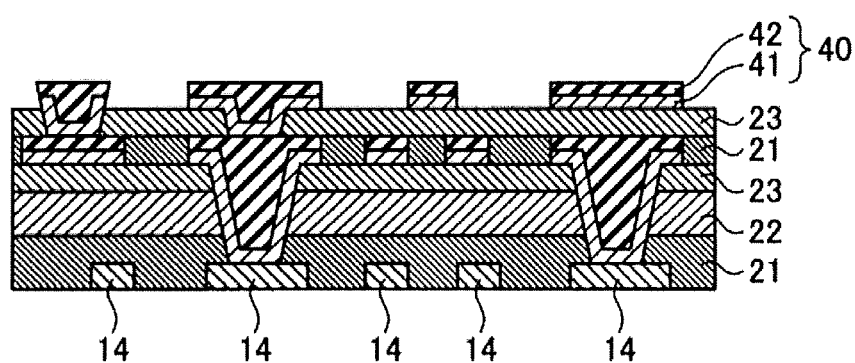
FIG. 21 is a schematic sectional view for illustrating the wiring board.
Figure 22:
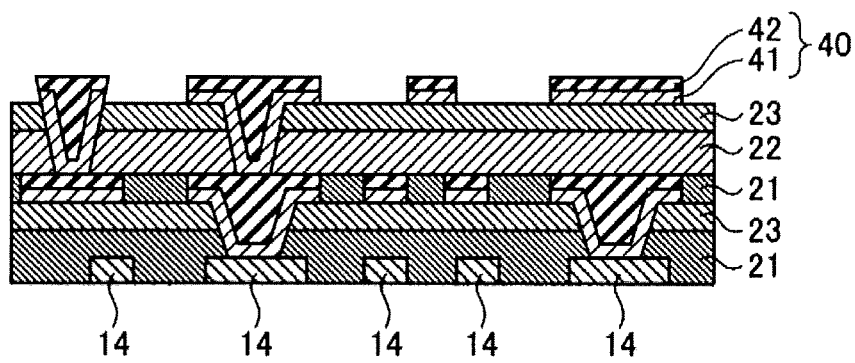
FIG. 22 is a schematic sectional view for illustrating the wiring board.
Figure 23:
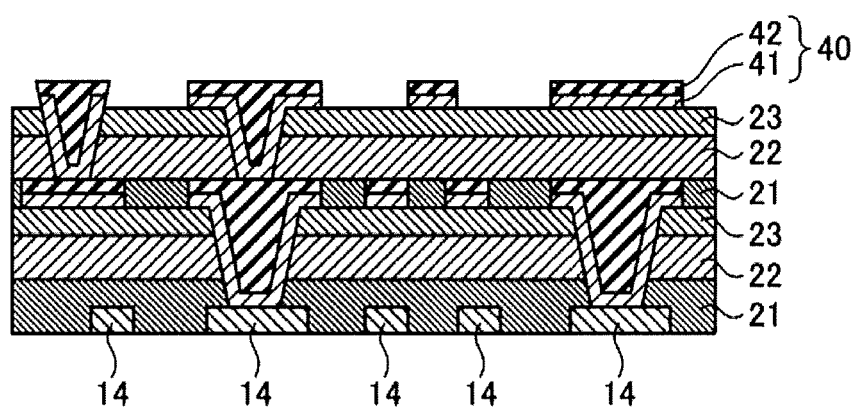
FIG. 23 is a schematic sectional view for illustrating the wiring board.

The wiring board of the present invention may be a multilayer wiring board. In this case, at least one resin film layer 22 bonding to the insulating layer 21 may be included. The resin film layer 22 may be included on the surface of the insulating layer 21 not bonding to the embedded-type wiring layer 14 as FIG. 21 illustrates an example, or the resin film layer 22 may be included on the surface of the insulating layer 21 bonding to the electroplated layer as FIG. 22 illustrates an example. As FIG. 23 illustrates an example, two or more resin film layers 22 may be included. Although the wiring board the examples of which are illustrated in FIG. 21 and FIG. 22 is obtained using the adhesive sheet in which the thermosetting resin composition layer is formed as two layers as an adhesive sheet other than the adhesive sheet including the resin film layer 22, and the insulating layer 21 and the insulating layer 23 are laminated, the wiring board may be obtained using the adhesive sheet in which the thermosetting resin composition layer is formed as a single layer as the adhesive sheet other than the adhesive sheet including the resin film layer 22, and only the insulating layer 21 (or the insulating layer 23) may be included.

Although FIG. 21 to FIG. 23 illustrate the multilayer wiring board that further includes the layer (iii) and is manufactured using the adhesive sheet when the layer (iii) is the thermosetting resin composition layer, the multilayer wiring board may be manufactured using the adhesive sheet the layer (iii) of which is the metallic foil, or the multilayer wiring board may be manufactured using the adhesive sheet that does not include the layer (iii), that is, the adhesive sheet including (i) thermosetting resin composition layer and (ii) the resin film layer.

The wiring board obtained by the method for manufacturing a wiring board of the present invention exhibits favorable bendability. In an embodiment, abnormalities such as cracks do not occur on both surfaces at a bent part after a bending test. This bending test can be measured in accordance with the method described in Bending Test (Crack) described below, for example. In an embodiment, a resistance value change after the bending test is 50% or less. The resistance value change after the bending test can be measured in accordance with the method described in Bending Test (Resistance Value Change) described below, for example.

The wiring board obtained by the method for manufacturing a wiring board of the present invention exhibits favorable reflow behavior. In an embodiment, reflow warpage behavior is 50 μm or less. The reflow warpage behavior can be measured in accordance with the method described in Evaluation of Reflow Warpage Behavior, for example.

Semiconductor Device

A semiconductor device of the present invention includes the wiring board of the present invention. The semiconductor device of the present invention can be manufactured using the wiring board of the present invention.

Examples of the semiconductor device include various kinds of semiconductor devices for use in electric products (such as computers, cellular phones, digital cameras, and TVs), vehicles (such as motorcycles, automobiles, electric trains, ships, and aircraft), and the like.

The semiconductor device of the present invention can be manufactured by mounting a component (a semiconductor chip) at a conducting part of a print wiring board. The "conducting part" is a "part that conveys electric signals in the print wiring board," and it may be on the surface or an embedded place. The semiconductor chip is not limited to a particular semiconductor chip so long as it is an electric circuit element formed of a semiconductor.

A method for mounting the semiconductor chip when the semiconductor device of the present invention is manufactured is not limited to a particular method so long as the semiconductor chip effectively functions. Specific examples thereof include a method of wire bonding mounting, a method of flip chip mounting, a method of mounting by Bumpless Build-up Layer (BBUL), a method of mounting by an anisotropic conductive film (ACF), and a method of mounting by a non-conductive film (NCF). The "method of mounting by Bumpless Build-up Layer (BBUL)" refers to a "method of mounting that directly embeds a semiconductor chip in a recess of a print wiring board and connects the semiconductor chip and wiring on the print wiring board."

Other features of the invention will become apparent in the course of the following descriptions of exemplary embodiments which are given for illustration of the invention and are not intended to be limiting thereof.

EXAMPLES

In the following examples, "parts" and "%" mean "parts by mass" and "% by mass," respectively, unless otherwise specified. The thicknesses of the respective layers of the adhesive sheet were measured using a contact-type layer thickness meter (MCD-25MJ manufactured by Mitutoyo Corporation).

Preparation of Evaluation Substrate (1) Process of Preparing Wiring Layer-Attached Base Including Base and Wiring Layer Provided on at least One Surface of Base (1-1) Lamination of Dry Film on Base (Core Substrate)

As a core substrate, a glass cloth base epoxy resin double-faced copper-clad laminate (layer structure: MicroThin MT-Ex (the thickness of a copper foil 3 µm/carrier copper foil 18 µm) manufactured by Mitsui Mining & Smelting Co., Ltd., "R1515A" substrate (thickness 0.2 mm) manufactured by Panasonic Corporation, and MicroThin MT-Ex (a carrier copper foil 18 µm/3-µm thick copper foil) manufactured by Mitsui Mining & Smelting Co., Ltd.) was prepared. On both surfaces of the 3-µm thick copper foils of the laminate, a PET film-attached dry film (manufactured by Hitachi Chemical Co., Ltd., a high-resolution type, thickness 15 µm) was laminated so as to cause the dry film to bond to the 3 µm-thick copper foils using a batch vacuum pressurizing laminator (a two-stage build-up laminator "CVP700" manufactured by Nikko-Materials Co., Ltd.). The lamination of the dry film was performed by reducing pressure for 30 seconds to give an atmospheric pressure of 13 hPa or less and performing compression at a temperature of 70° C. and a pressure of 0.1 MPa for 20 seconds.

(1-2) Formation of Pattern

A glass mask (a photomask) formed with the following pattern was arranged on a PET film, which is a protective layer of the dry film, and UV irradiation was performed with an irradiation intensity of 150 mJ/cm$^2$ by a UV lamp. After the UV irradiation, the PET film of the dry film was peeled, and a 30° C., 1% aqueous sodium carbonate solution was sprayed with an injection pressure of 0.15 MPa for 30 seconds. Subsequently, the dry film was washed with water, and the development (pattern formation) of the dry film was performed.

Wiring Pattern of Glass Mask:

Comb-shaped patterns, each of which has L/S=10 µm/10 µm, that is, a wiring pitch of 20 µm (wiring length 10 mm, 16 lines), were formed at intervals of 10 mm.

(1-3) Formation of Wiring Layer

After the development of the dry film, copper electroplating was performed with a thickness of 8 µm to form a wiring layer. Next, a 50° C., 3% aqueous sodium hydroxide solution was sprayed with an injection pressure of 0.2 MPa to peel the dry film, and the wiring layer was washed with water and was dried at 150° C. for 30 minutes.

(2) Process of Laminating Adhesive Sheet on Wiring Layer-Attached Base so that Wiring Layer Will be Embedded in (i) Thermosetting Resin Composition Layer and Performing Thermal Curing (2-1) Lamination of Adhesive Sheet The protective film of the adhesive sheet prepared in the examples and comparative examples (a mold release PET film with a thickness of 25 µm in Example 1 and a protective film with a thickness of 20 µm in Examples 2 to 3 and Comparative Examples 1 to 2) was peeled, and the adhesive sheet was laminated in an embedded manner on both wiring patterns so as to cause the thermosetting resin composition layer to bond to the wiring pattern using a batch vacuum pressurizing laminator (two-stage build-up laminator "CVP700" manufactured by Nikko-Materials Co., Ltd.). The lamination was performed by reducing pressure for 30 seconds to give an atmospheric pressure of 13 hPa or less and performing compression at a temperature of 110° C. and a pressure of 0.74 MPa for 30 seconds. Subsequently, the laminated adhesive sheet was hot pressed under atmospheric pressure, at 110° C. and a pressure of 0.5 MPa for 60 seconds to be flattened. This is named Evaluation Substrate A.

(2-2) Observation of Embeddability

The surface of the thermosetting resin composition layer of Evaluation Substrate A was observed with a microscope ("VH-5500" manufactured by Keyence Corporation); one that had no void and is embedded in the wiring pattern was evaluated as "pass", whereas one that had voids was evaluated as "fail."

(2-3) Thermosetting of Thermosetting Resin Composition Layer

After laminating the adhesive sheet, the thermosetting resin composition layer was thermoset at 100° C. for 30 minutes, and then at 170° C. (170° C. with a support: a mold release PET: 38 µm attached in Working Example 1 and Comparative Example 1) or 180° C. (180° C. with the mold release PET peeled in Working Example 2 and Comparative Example 2) for 30 minutes to form the insulating layers on both surfaces of the wiring layer.

(3) Process of Forming Via Holes in Insulating Layer

Lasers on the following conditions were applied from above the mold release PET or the carrier copper foil in Example 1 and Comparative Example 1 or from above the insulating layer in Example 2, Example 3, and Comparative Example 2 to form a via hole in the insulating layer immediately above the wiring layer of a 150-µm square to be a land of the wiring layer.

The process of forming the via hole was performed with conditions changed as described below.

(A) Using a $CO_2$ laser processing machine "605GTWIII (-P)" manufactured by Mitsubishi Electric Corporation, the laser was irradiated from above the mold release PET side to form a via hole with a top diameter of 30 µm in the insulating layer. Laser irradiation conditions were a mask diameter of 1 mm, a pulse width of 16 µs, an energy of 0.20 mJ/shot, the number of shots of 2, and a burst mode (10 kHz).

(B) Using a $CO_2$ laser processing machine "LC-2k212/2c" manufactured by Via Mechanics, the laser was irradiated from above the insulating layer to form a via hole with a top diameter of 50 µm in the insulating layer. Laser irradiation conditions were a mask diameter of 3 mm, a pulse width of 4 µs, a power of 0.8 W, the number of shots of 3, and a cycle mode (2 kHz).

(C) Using the $CO_2$ laser processing machine "605GTWIII (-P)" manufactured by Mitsubishi Electric Corporation, the laser was irradiated from above the copper foil with a thickness of 3 µm to form a via hole with a top diameter of 45 µm in the insulating layer. Laser irradiation conditions were a mask diameter of 1.5 mm, a pulse width of 16 µs, an energy of 0.36 mJ/shot, the number of shots 3, and a burst mode (10 kHz).

(3-1) Process of Performing Roughening Treatment

After forming the via hole, the mold release PET was peeled when it was bonded, and desmear treatment was performed on the structure formed with the via hole. For the desmear treatment, the following wet desmear treatment was performed.

Wet Desmear Treatment:

The circuit board formed with the via hole was immersed in a swelling liquid ("Swelling Dip Securiganth P," an aqueous solution of diethylene glycol monobutyl ether and sodium hydroxide manufactured by Atotech Japan K.K.) at 60° C. for 3 minutes, was then immersed in an oxidizer solution ("Concentrate Compact CP," an aqueous solution with a concentration of potassium permanganate of about 6% and with a concentration of sodium hydroxide of about 4% manufactured by Atotech Japan K.K.) at 80° C. for 8 minutes, was finally immersed in a neutralizing liquid ("Reduction Solution Securiganth P," an aqueous sulfuric acid solution manufactured by Atotech Japan K.K.) at 40° C. for 5 minutes, and was dried at 80° C. for 15 minutes.

(4) Process of Forming Conductor Layer (4-1) Electroless Plating Process

In order to form a conductor layer on the surface of the evaluation substrate A, a plating process containing the following 1 to 6 processes (a copper plating process using chemical solutions manufactured by Atotech Japan K.K.) was performed to form the conductor layer.

1. Alkaline Cleaning (Cleaning and Electric Charge Adjustment of the Surface of the Insulating Layer Formed with the Via Hole)

Using Cleaning Cleaner Securiganth 902 (product name), the surface was cleaned at 60° C. for 5 minutes.

2. Soft Etching (Cleaning of the Inside of the Via Hole)

Using a sulfuric acid-acidic sodium peroxodisulfate aqueous solution, treatment was performed at room temperature for 1 minute.

3. Predip (Adjustment of the Electric Charges on the Surface of the Insulating Layer for the Impartment of Pd)

Using Pre. Dip Neoganth B (product name), treatment was performed at room temperature for 1 minute.

4. Impartment of Activator (Impartment of Pd to the Surface of the Insulating Layer)

Using Activator Neoganth 834 (product name), treatment was performed at 35° C. for 5 minutes.

5. Reduction (Reduction of Pd Imparted to the Insulating Layer)

Using a mixed liquid of Reducer Neoganth WA (product name) and Reducer Accelerator 810 mod. (product name), treatment was performed at 30° C. for 5 minutes.

6. Electroless Copper Plating Process (Deposition of Cu on the Surface of the Insulating Layer (the Pd Surface))

Using a mixed liquid of Basic Solution Printganth MSK-DK (product name), Copper solution Printganth MSK (product name), Stabilizer Printganth MSK-DK (product name), and Reducer Cu (product name), treatment was performed at 35° C. for 20 minutes. The thickness of the formed electroless copper plated layer was 0.8 µm.

(4-2) Electroplating Process

Next, using a chemical solution manufactured by Atotech Japan K.K., a copper electroplating process was performed so as to fill the via hole with copper. Subsequently, as a resist pattern for patterning by etching, a land pattern with a diameter of 100 µm corresponding to the via hole was formed (formed across the entire surface with a 400-µm pitch even in a via connection-free part), and using this land pattern, a conductor layer having a conductor pattern with a thickness of 10 µm was formed on the surface of the insulating layer. Next, annealing treatment was performed at 190° C. for 60 minutes.

(5) Process of Removing Base

After laminating an adhesive-attached PET film (thickness 50 µm) on the entire surface of the wiring layer-attached base formed with the conductor layer, MicroThin MT-Ex copper foil of the core substrate was peeled at the interface between the copper foil with a thickness of 3 µm and the carrier foil with a thickness of 18 µm to separate the core substrate. Next, with the surface formed with the conductor layer protected with the adhesive-attached PET film, the 3-µm copper foil was removed by etching with a copper chloride aqueous solution, and the wiring layer-attached base was washed with water and was dried at 110° C. for 30 minutes. Subsequently, the adhesive-attached PET film was peeled to manufacture the wiring board in which an L/S=10/10 µm comb-shaped pattern was embedded in one surface. The obtained wiring board is referred to as "Evaluation Substrate B."

Bending Test (Crack)

Evaluation Substrate B was cut into a test piece with a width of 15 mm and a length of 110 mm, and using an MIT test apparatus (an MIT bending-resistance fatigue test machine "MIT-DA" manufactured by Toyo Seiki Seisaku-sho, Ltd.), bending was applied to the central part of the comb-shaped pattern in the vertical direction 20 times under measurement conditions with a load of 2.5 N, a bending angle of 90 degrees, a bending radius of 1.0 mm, and a bending speed of 175 times/minute, and the bent part was observed with a microscope ("VH-5500" manufactured by Keyence Corporation). One having no occurrence of abnormalities such as cracks on both surfaces was evaluated as "pass," whereas one having some was evaluated as "fail."

Bending Test (Resistance Value Change)

Further, for the embedded-type substrate the L/S=10/10 µm comb-shaped patterns (wire length 10 mm, 16 lines) of the bent part, an insulation resistance value ($\Omega$) was measured by an electrochemical migration tester ("ECM-100" manufactured by J-RAS Corporation). The insulation resistance value ($\Omega$) was evaluated in accordance with the following evaluation criteria.

Evaluation Criteria:

Pass: the resistance value change after bending is 50% or less.

Fail: the resistance value change after bending exceeds 50%.

Evaluation of Reflow Warpage Behavior

Evaluation Substrate B was cut into five 30-mm square pieces, which were passed through a reflow apparatus ("HAS-6116" manufactured by Antom Co., Ltd.) that reproduces solder reflow temperature with a peak temperature of 260° C. once (a reflow temperature profile was pursuant to IPC/JEDEC J-STD-020C). Next, using a shadow moire apparatus ("TherMoire AXP" manufactured by Akrometrix), the lower surface of Evaluation Substrate B was heated in accordance with the reflow temperature profile pursuant to IPC/JEDEC J-STD-020C (a peak temperature of 260° C.), and the displacement amount of a 5 mm square part in the substrate center was measured. The measurement was performed for the five pieces, and their average was determined. Evaluation was performed in accordance with the following evaluation criteria:

Evaluation Criteria:

Pass: the displacement amount is 50 µm or less.

Fail: the displacement amount exceeds 50 µm.

Measurement of Lowest Melt Viscosity of Thermosetting Resin Composition Layer

Only the thermosetting resin composition layers of the respective examples and the respective comparative examples were peeled and were compressed by a mold to prepare pellets for measurement (diameter 18 mm, 1.2 to 1.3 g).

Using the pellets for measurement, using a dynamic viscoelasticity measuring apparatus ("Rheosol-G3000" manufactured by UBM), the temperature of 1 g of a sample thermosetting resin composition layer was raised from a starting temperature of 60° C. to 200° C. at a temperature rising rate of 5° C./min using a parallel plate with a diameter of 18 mm. A dynamic viscoelastic modulus was measured under measurement conditions with a temperature measurement interval of 2.5° C., a frequency of 1 Hz, and a strain of 1 deg, and the lowest melt viscosity (poise) was calculated.

Measurement of Elongation at Break

Adhesive sheets having only a 30-μm thick thermosetting resin composition layer prepared in Adhesive Sheets 1 to 3 were heated at 190° C. for 90 minutes to thermally cured the thermosetting resin composition layer. After that, a mold release PET film ("PET501010" (thickness 50 μm) manufactured by Lintec Corporation) was peeled. The obtained hardened product (30-μm thick) was cut into a dumbbell shape, and the test piece was subjected to tensile strength measurement using a tensile testing machine RTC-1250A manufactured by Orientec Corporation pursuant to JIS K 7127 to determine elongation at break at 23° C. This operation was performed five times to calculate an average of upper three points, resulting in 5.5% for Example 1 and 3.1% for both Example 2 and Example 3.

Preparation of Adhesive Sheet 1 Used in Example 1

(1) Preparation of Resin Varnish 1

Nine parts of a bisphenol-type epoxy resin ("ZX1059" manufactured by Nippon Steel Chemical Co., Ltd., a 1:1 mixture of a bisphenol A type and a bisphenol F type, epoxy equivalent 169), 6 parts of a crystalline difunctional epoxy resin ("YX4000HK" manufactured by Mitsubishi Chemical Corporation, epoxy equivalent about 185), 15 parts of a biphenyl-type epoxy resin ("NC3000H" manufactured by Nippon Kayaku Co., Ltd., epoxy equivalent 288), and 15 parts of a phenoxy resin ("YX6954BH30" manufactured by Mitsubishi Chemical Corporation, a 1:1 solution of methyl ethyl ketone (MEK) and cyclohexanone with a solid content of 30% by mass) were heated and dissolved in 10 parts of solvent naphtha with stirring. The mixture heated and dissolved was cooled to room temperature, which was then mixed with 10 parts of a triazine skeleton-containing phenol-based curing agent (a MEK solution with a solid content of 60% of "LA-7054" with a hydroxy group equivalent of 125 manufactured by DIC Corporation), 10 parts of a naphthalene-type curing agent (a MEK solution with a solid content of 60% of "SN-485" with a hydroxy group equivalent of 215 manufactured by Nippon Steel Chemical Co., Ltd.), 15 parts of a polyvinyl acetal resin ("BX-5Z" manufactured by Sekisui Chemical Co., Ltd., a 1:1 solution of ethanol and toluene with a solid content of 15% by mass), 0.2 part of a curing promoter (4-dimethylaminopyridine (DMAP), a MEK solution with a solid content of 5% by mass), 0.1 part of an imidazole-based curing promoter ("P200-H50" manufactured by Mitsubishi Chemical Corporation, a propylene glycol monomethylether solution with a solid content of 50% by mass), 3 parts of a flame retardant ("HCA-HQ" manufactured by Sanko Co., Ltd., 10-(2,5-dihydroxyphenyl)-10-hydro-9-oxa-10-phosphaphenanthrene-10-oxide, average particle diameter 2 μm), and 40 parts of spherical silica (average particle diameter 0.5 μm, "SOC2" manufactured by Admatechs Co., Ltd., a carbon amount per unit area 0.39 mg/m$^2$) subjected to surface treatment with a phenylaminosilane-based silane coupling agent ("KBM573" manufactured by Shin-Etsu Chemical Co., Ltd.), and the mixture was uniformly dispersed by a high-speed rotary mixer and was filtered by a cartridge filter ("SHP050" manufactured by ROKITECHNO) to prepare Resin Varnish 1.

(2) Preparation of Resin Varnish 2

Nine parts of a bisphenol-type epoxy resin ("ZX1059" manufactured by Nippon Steel Chemical Co., Ltd., a 1:1 mixture of a bisphenol A type and a bisphenol F type, epoxy equivalent 169), 6 parts of a crystalline difunctional epoxy resin ("YX4000HK" manufactured by Mitsubishi Chemical Corporation, epoxy equivalent about 185), 15 parts of a biphenyl-type epoxy resin ("NC3000H" manufactured by Nippon Kayaku Co., Ltd., epoxy equivalent 288), and 15 parts of a phenoxy resin ("YX6954BH30" manufactured by Mitsubishi Chemical Corporation, a 1:1 solution of methyl ethyl ketone (MEK) and cyclohexanone with a solid content of 30% by mass) were heated and dissolved in 10 parts of solvent naphtha with stirring. The mixture heated and dissolved was cooled to room temperature, which was then mixed with 10 parts of a triazine skeleton-containing phenol-based curing agent (a MEK solution with a solid content of 60% of "LA-7054" with a hydroxy group equivalent of 125 manufactured by DIC Corporation), 10 parts of a naphthalene-type curing agent (a MEK solution with a solid content of 60% of "SN-485" with a hydroxy group equivalent of 215 manufactured by Nippon Steel Chemical Co., Ltd.), 15 parts of a polyvinyl acetal resin ("KS-1" manufactured by Sekisui Chemical Co., Ltd., a 1:1 solution of ethanol and toluene with a solid content of 15% by mass), 0.4 part of a curing promoter (4-dimethylaminopyridine (DMAP), a MEK solution with a solid content of 5% by mass), 0.4 part of an imidazole-based curing promoter ("P200-H50" manufactured by Mitsubishi Chemical Corporation, a propylene glycol monomethylether solution with a solid content of 50% by mass), 2 parts of rubber particles (AC3816N (manufactured by Ganz Chemical Co., Ltd.) swollen in 8 parts of solvent naphtha at room temperature for 12 hours), and 30 parts of spherical silica (average particle diameter 0.24 μm, "SOC1" manufactured by Admatechs Co., Ltd., a carbon amount per unit area 0.36 mg/m$^2$) subjected to surface treatment with a phenylaminosilane-based silane coupling agent ("KBM573" manufactured by Shin-Etsu Chemical Co., Ltd.), and the mixture was uniformly dispersed by a high-speed rotary mixer and was filtered by a cartridge filter ("SHP030" manufactured by ROKITECHNO) to prepare Resin Varnish 2.

(3) Preparation of Adhesive Sheet 1

Resin Varnish 1 was uniformly applied to the mold release surface of a mold release-treated polyethylene terephthalate film (hereinafter, abbreviated as a mold release PET) ("AL5" manufactured by Lintec Corporation, thickness 25 μm) so as to make Thermosetting Resin Composition Layer 1 after being dried 10 μm thick, and was dried at 80 to 120° C. (with an average of 100° C.) for 2.5 minutes to form Thermosetting Resin Composition Layer 1. After that, a polyimide film ("Kapton 20EN" manufactured by Du Pont-Toray Co., Ltd., thickness 5 μm, double-face plasma treated) was laminated so as to bond to Thermosetting Resin Composition Layer 1 by a heated roll to prepare Adhesive Sheet (1-1).

Resin Varnish 2 was uniformly applied to the mold release surface of a mold release PET ("AL5" manufactured by Lintec Corporation, thickness 38 μm) so as to make Thermosetting Resin Composition Layer 2 after being dried 3 μm thick, and was dried at 80 to 120° C. (with an average of 100° C.) for 2 minutes to form Thermosetting Resin Composition Layer 2. After that, the polyimide film surface of Adhesive Sheet (1-1) was laminated so as to bond to Thermosetting Resin Composition Layer 2 by a heated roll to obtain Adhesive Sheet 1 having a configuration of the mold release PET (25 μm)/Thermosetting Resin Composition Layer 1 (10 μm)/the polyimide film (5 μm)/Thermosetting Resin Composition Layer 2 (3 μm)/the mold release PET (38 μm).

Preparation of Adhesive Sheet 2 Used in Example 2

(1) Preparation of Resin Varnish 3

Fifty parts of Polymer Resin A prepared as described below, 3 parts of a bisphenol-type epoxy resin ("ZX1059" manufactured by Nippon Steel Chemical Co., Ltd., a 1:1 mixture of a bisphenol A type and a bisphenol F type, epoxy equivalent 169), 3 parts of a crystalline difunctional epoxy resin ("YX4000HK" manufactured by Mitsubishi Chemical Corporation, epoxy equivalent about 185), and 3 parts of a naphthalene-type epoxy resin ("HP4032SS" manufactured by DIC Corporation, epoxy equivalent about 144) were heated and dissolved in 25 parts of solvent naphtha with stirring. The mixture heated and dissolved was cooled to room temperature, which was then mixed with 4 parts of an activated ester compound ("HPC8000-65T" manufactured by DIC Corporation, weight average molecular weight about 2,700, a toluene solution with an active group equivalent of about 223 and a non-volatile content of 65% by mass), 0.4 part of a curing promoter (4-dimethylaminopyridine (DMAP), a MEK solution with a solid content of 5% by mass), 0.3 part of an imidazole-based curing promoter ("P200-H50" manufactured by Mitsubishi Chemical Corporation, a propylene glycol monomethylether solution with a solid content of 50% by mass), and 60 parts of spherical silica (average particle diameter 0.5 μm, "SOC2" manufactured by Admatechs Co., Ltd., a carbon amount per unit area 0.39 mg/m$^2$) subjected to surface treatment with a phenylaminosilane-based silane coupling agent ("KBM573" manufactured by Shin-Etsu Chemical Co., Ltd.), and the mixture was uniformly dispersed by a high-speed rotary mixer and was filtered by a cartridge filter ("SHP050" manufactured by ROKITECHNO) to prepare Resin Varnish 3.

Preparation of Polymer Resin A

In a reaction vessel, 50 g of G-3000 (a difunctional hydroxy group-terminated polybutadiene, number average molecular weight=5,047 (a number average molecular weight in terms of polystyrene by GPC), hydroxy group equivalent: 1,798 g/eq., solid content 100% by mass: manufactured by Nippon Soda Co., Ltd.), 23.5 g of Ipsol 150 (an aromatic hydrocarbon-based mixed solvent: manufactured by Idemitsu Petrochemical Co., Ltd.), and 0.005 g of dibutyl tin laurate were mixed and were uniformly dissolved. When the mixture became uniform, the temperature thereof was raised to 50° C., 4.8 g of toluene-2,4-diisocyanate (isocyanate group equivalent: 87.08 g/eq.) was added thereto with further stirring, and the mixture was reacted for 3 hours. Next, this reactant was cooled to room temperature, 8.96 g of benzophenone tetracarboxylic acid dianhydride (acid dianhydride equivalent: 161.1 g/eq.), 0.07 g of triethylenediamine, and 40.4 g of ethyl diglycol acetate (manufactured by Daicel Corporation) were added thereto, the temperature of the mixture was raised up to 130° C. with stirring, and the mixture was reacted for 4 hours. The disappearance of an NCO peak at 2,250 cm$^{-1}$ was checked by FT-IR. Checking the NCO peak disappearance was regarded as the end point of the reaction, the temperature of the reactant was dropped to room temperature, and the reactant was filtered by 100-mesh filter cloth to obtain Polymer Resin A having an imide skeleton, a urethane skeleton, and a butadiene skeleton.

Viscosity: 7.5 Pa·s (25° C., E-type viscometer)

Acid value: 16.9 mgKOH/g

Solid content: 50% by mass

Number average molecular weight: 13,723 (in terms of polystyrene by GPC)

Glass transition temperature: −10° C. (measured by DSC)

Content of polybutadiene structure moiety: 50/(50+4.8+8.96)×100=78.4% by mass.

(2) Preparation of Adhesive Sheet 2

A polyimide film ("Apical 10NPI" manufactured by Kaneka Corporation, thickness 10 μm, double-face corona treated) was immersed in Resin Varnish 3, was squeezed so as to make both the thermosetting resin composition layers after being dried 10 μm thick, and was dried at 80 to 120° C. (with an average of 100° C.) for 3 minutes to form Thermosetting Resin Composition Layer 3. After that, a mold release PET ("AL5" manufactured by Lintec Corporation, thickness 38 μm) was laminated on one resin surface, while a protective film (a polypropylene film, "Alphan MA-430" manufactured by Oji F-Tex Co., Ltd., thickness 20 μm) was laminated on the other surface by a heated roll to obtain Adhesive Sheet 2 having a configuration of the mold release PET (38 μm)/Thermosetting Resin Composition Layer 3 (10 μm)/the polyimide film (10 μm)/Thermosetting Resin Composition Layer 3 (10 μm)/the protective film (20 μm).

Preparation of Adhesive Sheet 3 Used in Example 3

Resin Varnish 3 was uniformly applied to the polyimide film of a two-layer, single-faced copper-clad polyimide film (manufactured by Arisawa Mfg. Co., Ltd., obtained by forming a polyimide film with a thickness of 12.5 μm on the top surface of the copper foil with a thickness of 3 μM of MicroThin MT-Ex manufactured by Mitsui Mining & Smelting Co., Ltd. (the 18-μm carrier copper foil/the 3-μm thickness copper foil)) so as to make Thermosetting Resin Composition Layer 3 after being dried 10 μm thick, and was dried at 80 to 120° C. (with an average of 100° C.) for 2.5 minutes to form Thermosetting Resin Composition Layer 3. After that, a protective film (a polypropylene film, "Alphan MA-430" manufactured by Oji F-Tex Co., Ltd., thickness 20 μm) was laminated so as to bond to Thermosetting Resin Composition Layer 3 to obtain Adhesive Sheet 3 having a configuration of the copper foil (the 18-μm carrier copper foil/the 3-μm thickness copper foil)/the polyimide film (12.5 μm)/Thermosetting Resin Composition Layer 3 (10 μm)/the protective film (20 μm).

Preparation of Adhesive Sheet 4 Used in Comparative Example 1

Resin Varnish 1 was uniformly applied to the mold release surface of a mold release PET ("AL5" manufactured by Lintec Corporation, thickness 38 μm) so as to make Thermosetting Resin Composition Layer 1 after being dried 18 μm thick, and was dried at 80 to 120° C. (with an average of 100° C.) for 3 minutes to form Thermosetting Resin Composition Layer 1. After that, a protective film (a polypropylene film, "Alphan MA-430" manufactured by Oji F-Tex Co., Ltd., thickness 20 μm) was laminated so as to bond to Thermosetting Resin Composition Layer 1 to obtain Adhesive Sheet 4 having a configuration of the mold release PET (38 μm)/Thermosetting Resin Composition Layer 1 (18 μm)/the protective film (20 μm).

Preparation of Adhesive Sheet 5 Used in Comparative Example 2

Resin Varnish 3 was uniformly applied to the mold release surface of a mold release PET ("AL5" manufactured by Lintec Corporation, thickness 38 μm) so as to make Thermosetting Resin Composition Layer 3 after being dried 30 μm thick, and was dried at 80 to 120° C. (with an average of 100° C.) for 4 minutes to form Thermosetting Resin Composition Layer 3. After that, a protective film (a polypropylene film, "Alphan MA-430" manufactured by Oji F-Tex Co., Ltd., thickness 20 μm) was laminated so as to bond to Thermosetting Resin Composition Layer 3 to obtain Adhesive Sheet 5 having a configuration of the mold release PET (38 μm)/Thermosetting Resin Composition Layer 3 (30 μm)/the protective film (20 μm).

TABLE 1

|  |  | Resin varnish | | |
|---|---|---|---|---|
|  |  | 1 | 2 | 3 |
| Component (a) | HP4032SS | 0 | 0 | 3 |
|  | ZX1059 | 9 | 9 | 3 |
|  | NC3000H | 15 | 15 | 0 |
|  | YX4000HK | 6 | 6 | 3 |
| Component (b) | LA-7054 | 6 | 6 | 0 |
|  | SN-485 | 6 | 6 | 0 |
|  | HPC8000-65T | 0 | 0 | 2.6 |
| Component (c) | SOC2 | 40 | 0 | 60 |
|  | SOC1 | 0 | 30 | 0 |
| Component (d) | YX6954BH30 | 4.5 | 4.5 | 0 |
|  | BX-5Z | 2.25 | 0 | 0 |
|  | KS-1 | 0 | 2.25 | 0 |
| Component (e) | DMAP | 0.01 | 0.02 | 0.02 |
|  | P200-H50 | 0.05 | 0.2 | 0.15 |
| Component (f) | HCA-HQ | 3 | 0 | 0 |
| Component (g) | AC3816N | 0 | 2 | 0 |
| Other | Polymer resin A | 0 | 0 | 25 |

* Represented in terms of non-volatile component

TABLE 2

|  |  |  | Examples | | | Comparative Examples | |
|---|---|---|---|---|---|---|---|
|  |  |  | 1 | 2 | 3[1) | 1 | 2 |
| Adhesive sheet | Layer (iii) | Resin varnish No., Metallic foil | 2 | 3 | Copper foil | — | — |
|  |  | Thickness (μm) | 3 | 10 | 21 | — | — |
|  | Layer (ii) | Type | Kapton 20EN | Apical 10NPI | Polyimide film | — | — |
|  |  | Thickness (μm) | 5 | 10 | 12.5 | — | — |
|  | Layer (i) | Resin varnish | 1 | 3 | 3 | 1 | 3 |
|  |  | Thickness (μm) | 10 | 10 | 10 | 18 | 30 |
|  |  | Lowest melt viscosity (poise) | 1800 | 8200 | 7900 | 1600 | 7400 |
| Evaluation | Laser processing condition | | A | B | C | A | B |
|  | Embeddability | | Pass | Pass | Pass | Pass | Pass |
|  | Bendability (crack) | | Pass | Pass | Pass | Pass | Pass |
|  | Bendability (resistance value change) | | Pass | Pass | Pass | Fail | Fail |
|  | Reflow warpage behavior | | Pass | Pass | Pass | Fail | Fail |

[1)In the two-layer, single-faced copper-clad polyimide film, the copper foil part was regarded as the layer (iii) (the thickness is a total value), whereas the polyimide film part was regarded as the resin film layer (the layer (ii)).

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A method for manufacturing a wiring board, said method comprising (a) to (e) in this order:
 (a) preparing a wiring layer-attached base comprising a base and a wiring layer provided on at least one surface of said base;
 (b) laminating an adhesive sheet comprising (i) a thermosetting resin composition layer and (ii) a resin film layer on said wiring layer-attached base so that said wiring layer will be embedded in (i) said thermosetting resin composition layer and performing thermal curing to form an insulating layer;
 (c) forming a via hole in said insulating layer;
 (d) forming a conductor layer on a surface of said insulating layer; and
 (e) removing said base;
 wherein the resin film layer consists of at least one member selected from the group consisting of polyimide, polyethylene terephthalate, polyethylene naphthalate, a liquid crystal polymer, polyphenylene sulfide, polyether ether ketone, polybenzimidazole, aramid, polyamideimide, and polyether imide; and
 the thermosetting resin composition layer comprises at least one epoxy resin, at least one curing agent and at least one inorganic filler,
 wherein, when a non-volatile component in said thermosetting resin composition layer is defined as 100% by mass, said inorganic filler is present in an amount of from 20% to 62% by mass.

2. The method according to claim 1, wherein said adhesive sheet further comprises (iii) metallic foil or a thermosetting resin composition layer and comprises (i) said thermosetting resin composition layer, (ii) said resin film layer, and (iii) said metallic foil or the thermosetting resin composition layer in this order.

3. The method according to claim 1, wherein forming said via hole is performed by laser irradiation.

4. The method according to claim 1, further comprising performing a roughening treatment prior to forming said conductor layer.

5. The method according to claim 1, wherein said wiring board is a flexible wiring board.

6. The method according to claim 1, wherein said adhesive sheet exhibits elongation at break after thermal curing of 2% or more.

7. The method according to claim 1, wherein a surface of (ii) said resin film layer is subjected to corona treatment, plasma treatment, or UV treatment.

8. The method according to claim 1, wherein said metallic foil is copper foil.

9. The method according to claim 1, wherein a minimum pitch of a wiring pattern is 40 μm or less.

10. The method according to claim 1, wherein in (d) the conductor layer is formed on a surface of said insulating layer, wherein said surface is in said via hole.

\* \* \* \* \*